US006933182B1

(12) United States Patent
Yamazaki et al.

(10) Patent No.: US 6,933,182 B1
(45) Date of Patent: Aug. 23, 2005

(54) METHOD OF MANUFACTURING A SEMICONDUCTOR DEVICE AND MANUFACTURING SYSTEM THEREOF

(75) Inventors: Shunpei Yamazaki, Tokyo (JP); Satoshi Teramoto, Kanagawa (JP); Naoto Kusumoto, Kanagawa (JP); Hideto Ohnuma, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 09/259,211

(22) Filed: Mar. 1, 1999

Related U.S. Application Data

(62) Division of application No. 08/616,623, filed on Mar. 15, 1996, now Pat. No. 5,956,581.

(30) Foreign Application Priority Data

| Apr. 20, 1995 | (JP) | 7-120678 |
| Apr. 20, 1995 | (JP) | 7-120679 |
| Apr. 26, 1995 | (JP) | 7-125908 |
| Apr. 26, 1995 | (JP) | 7-125909 |
| Apr. 28, 1995 | (JP) | 7-128922 |

(51) Int. Cl.⁷ .................. H01L 21/00; H01L 21/336
(52) U.S. Cl. .................. 438/151; 438/166; 438/308; 438/486
(58) Field of Search ................. 118/723 MW, 118/723 MA, 723 ME, 723 MR, 719; 156/345; 204/298.25, 298.35; 438/151, 166, 308, 486

(56) References Cited

U.S. PATENT DOCUMENTS

| 4,489,478 A | * | 12/1984 | Sakurai | 438/18 |
| 4,597,160 A | * | 7/1986 | Ipri | 438/166 |
| 4,727,044 A | * | 2/1988 | Yamazaki | 438/166 |
| 5,147,826 A | | 9/1992 | Liu et al. | |
| 5,262,350 A | * | 11/1993 | Yamazaki et al. | |
| 5,275,851 A | | 1/1994 | Fonash et al. | |
| 5,278,093 A | * | 1/1994 | Yonehara et al. | |
| 5,281,546 A | * | 1/1994 | Possin et al. | 438/158 |
| 5,313,076 A | | 5/1994 | Yamazaki et al. | |
| 5,344,796 A | * | 9/1994 | Shin et al. | 438/486 |

(Continued)

FOREIGN PATENT DOCUMENTS

| JP | 01-187875 | 7/1989 | | |
| JP | 02-119122 | 5/1990 | | |
| JP | 02-188499 | 7/1990 | | |
| JP | 2-61032 | 12/1990 | | |
| JP | 04-22120 | 1/1992 | | |
| JP | 4-35021 | * 2/1992 | ........ | 438/FOR 448 |
| JP | 04035021 | * 2/1992 | | |
| JP | 04-100211 | 4/1992 | | |
| JP | 4-286336 | * 10/1992 | ........ | 438/FOR 448 |
| JP | 5-129235 | 5/1993 | | |

(Continued)

OTHER PUBLICATIONS

Bonnel et al., "Polycrystalline Silicon Thin–Film Transistors With Two–Step Annealing Process", IEEE Electron Device Letters, vol. 14, No. 12, Dec. 1993, pp. 551–553.*

Fuse et al., "Performance of Poly–Si Thin Film Transistors Fabricated by Excimer–Laser Annealing of SiH4 and Si2H6 Source Low Pressure Vapor Deposited a–Si Films With or Without Solid–Phase Crystallization", Solid State Phenomena, vols. 37–38, 1994, pp. 5.*

*Primary Examiner*—Luz Alejandro-Mulero
(74) *Attorney, Agent, or Firm*—Fish & Richardson P.C.

(57) ABSTRACT

A method of manufacturing a semiconductor device, comprises the steps of: forming an amorphous silicon film on a substrate having an insulating surface; processing said amorphous silicon film by plasma of a gas that mainly contains hydrogen or helium; and giving an energy to said amorphous silicon film.

31 Claims, 13 Drawing Sheets

U.S. PATENT DOCUMENTS

| | | | | |
|---|---|---|---|---|
| 5,352,291 A | * | 10/1994 | Zhang et al. | 117/8 |
| 5,387,542 A | * | 2/1995 | Yamamoto et al. | |
| 5,397,718 A | * | 3/1995 | Furuta et al. | 438/158 |
| 5,403,772 A | | 4/1995 | Zhang et al. | |
| 5,424,230 A | * | 6/1995 | Wakai | |
| 5,486,237 A | * | 1/1996 | Sano et al. | 438/486 |
| 5,488,000 A | | 1/1996 | Zhang et al. | |
| 5,501,989 A | * | 3/1996 | Takayama et al. | 438/486 |
| 5,508,216 A | * | 4/1996 | Inoue | 438/151 |
| 5,508,533 A | | 4/1996 | Takemura | |
| 5,529,937 A | | 6/1996 | Zhang et al. | |
| 5,531,182 A | | 7/1996 | Yonehara | |
| 5,550,070 A | | 8/1996 | Funai et al. | |
| 5,578,520 A | * | 11/1996 | Zhang et al. | 437/81 |
| 5,582,880 A | * | 12/1996 | Mochizuki et al. | 427/569 |
| 5,583,369 A | | 12/1996 | Yamazaki et al. | |
| 5,608,232 A | | 3/1997 | Yamazaki et al. | |
| 5,624,851 A | | 4/1997 | Takayama et al. | |
| 5,637,515 A | | 6/1997 | Takemura | |
| 5,639,698 A | | 6/1997 | Yamazaki et al. | |
| 5,654,203 A | | 8/1997 | Ohtani et al. | |
| 5,677,549 A | | 10/1997 | Takayama et al. | |
| 5,696,386 A | | 12/1997 | Yamazaki | |
| 5,766,344 A | | 6/1998 | Zhang et al. | |
| 5,766,360 A | * | 6/1998 | Sato et al. | 118/666 |
| 5,840,118 A | * | 11/1998 | Yamazaki | 117/103 |
| 5,843,225 A | | 12/1998 | Takayama et al. | |
| 5,854,096 A | | 12/1998 | Ohtani et al. | |
| 5,861,337 A | * | 1/1999 | Zhang et al. | 438/437 |
| 5,873,942 A | * | 2/1999 | Park et al. | 118/719 |
| 5,882,165 A | * | 3/1999 | Maydan et al. | 414/217 |
| 5,897,347 A | | 4/1999 | Yamazaki et al. | |
| 5,900,105 A | * | 5/1999 | Toshima | 156/345 |
| 5,923,968 A | * | 7/1999 | Yamazaki et al. | 438/166 |
| 5,946,561 A | | 8/1999 | Yamazaki et al. | |
| 5,956,579 A | | 9/1999 | Yamazaki et al. | |
| 5,956,581 A | * | 9/1999 | Yamazaki et al. | 438/166 |
| 5,976,259 A | * | 11/1999 | Yamazaki | 118/719 |
| 6,084,247 A | | 7/2000 | Yamazaki et al. | |
| 6,271,066 B1 | | 8/2001 | Yamazaki et al. | |
| 6,576,534 B1 | | 6/2003 | Zhang et al. | |
| 2001/0051416 A1 | | 12/2001 | Yamazaki et al. | |
| 2003/0207524 A1 | | 11/2003 | Zhang et al. | |

FOREIGN PATENT DOCUMENTS

| | | | | |
|---|---|---|---|---|
| JP | 05-136111 | | 6/1993 | |
| JP | 05-190450 | | 7/1993 | |
| JP | 05-198507 | | 8/1993 | |
| JP | 06-333824 | | 1/1994 | |
| JP | 06-089905 | | 3/1994 | |
| JP | 06-097073 | | 4/1994 | |
| JP | 06-244103 | | 9/1994 | |
| JP | 6-310494 | | 11/1994 | |
| JP | 06-318700 | | 11/1994 | |
| JP | 06-333823 | | 12/1994 | |
| JP | 06-333953 | | 12/1994 | |
| JP | 07-058339 | | 3/1995 | |
| JP | 07-94757 | | 4/1995 | |
| WO | 93/10555 | * | 5/1993 | 438/FOR 448 |

* cited by examiner

IMPURITY IONS

METHOD OF MANUFACTURING A SEMICONDUCTOR DEVICE AND MANUFACTURING SYSTEM THEREOF

This is a divisional of U.S. application Ser. No. 08/616,623, filed Mar. 15, 1996 now U.S. Pat. No. 5,956,581.

BACKGROUND OF THE INVENTION

1. Field of the Invention

The present invention relates to a method of manufacturing a thin-film semiconductor device which is formed on a substrate having an insulating surface of a glass substrate or the like. Also, the present invention relates to a method of manufacturing a semiconductor device (for example, a thin-film transistor) using a thin-film semiconductor device.

2. Description of the Related Art

In recent years, attention has been paid to a thin-film transistor as a semiconductor device using a thin-film semiconductor device. In particular, attention has been paid to a structure in which a thin-film transistor is mounted on a liquid-crystal electro-optic device. This is to constitute the thin-film transistor using a thin-film semiconductor device which is formed on a glass substrate constituting the liquid-crystal electro-optic unit. In this case, the thin-film transistor is disposed on each pixel electrode of the liquid-crystal electro-optic device and functions as a switching element that controls charges going in and out of the pixel electrode. Such a structure is called an active matrix liquid-crystal display unit and is capable of displaying an image with very high quality.

The active matrix liquid-crystal display unit, in general, has a structure in which an IC circuit constituting a peripheral drive circuit for driving a pixel thin-film transistor is disposed on a glass substrate through the COG technique, or the like. In other words, there is adopted a structure in which a large number of IC chips are disposed on the peripheral portion of a pixel region where a large number of pixels are arranged in the form of a matrix.

However, this structure is complicated in wiring from the IC chip and lower in productivity and reliability. Also, the existence of an external circuit such as the IC circuit makes a liquid-crystal panel thick. This problem leads to the lowering of the degree of the general purpose of the liquid-crystal panel.

As a structure that solves such a problem, there has been proposed a structure in which a drive circuit for driving the thin-film transistor disposed in the pixel region is also integrated with the liquid-crystal display unit (for example, refer to Japanese Patent Examined Publication No. Hei 261032).

This has a structure in which a pixel region and a peripheral drive circuit for driving a thin-film transistor in the pixel region are integrated with each other on one translucent substrate (glass substrate is generally used) This structure can be made simple and high in the degree of the general purpose.

The peripheral drive circuit is comprised of a shift register, an analog buffer circuit and other circuits that deal with an image signal. It is needless to say that those circuits are demanded to operate at the operation frequency of the image signal.

In order to solve the above difficulty, there has been adopted such a structure that a method of dealing with the image signal is devised, or circuits are arranged in parallel. However, those devices lead to such a situation that the operation method or the circuit structure is complicated, to thereby lower the practicability.

In order to solve this problem, the characteristic of an amorphous silicon film is enhanced. To achieve this, it is useful that the amorphous silicon film is crystallized into a crystalline silicon film. For a method of obtaining the crystalline silicon film, there has been known a method of subjecting an amorphous silicon film which has been formed through the plasma CVD technique or the decompression thermal CVD technique to a heat treatment.

However, in case of using a thin-film transistor in the active matrix liquid-crystal electro-optic device, there arises such a problem that a glass substrate need be utilized as a substrate from the viewpoint of economics. In order to crystalize the amorphous silicon by heating, a heat treatment must be conducted at a temperature of 600° C. or higher for several tens hours or longer.

However, even though a thin-film transistor is constituted using the crystalline silicon film obtained in the above manner, the transistor cannot operate at a frequency except for several MHz or lower. In other words, the image signal generally has a frequency band of several MHz to several tens MHz or higher, and the general thin-film transistor does not normally operate at a frequency except for about several MHz or lower even though the crystalline silicon film is used therefor.

The glass substrate is warped or deformed by heating at 600° C. or higher for several tens hours or longer. This becomes remarkable in particular when the glass substrate is increased in area. Since the liquid-crystal electro-optic device is required to has a structure in which liquid crystal is interposed and held between a pair of glass substrates which are laminated at an interval of several μm, the deformation of the glass substrate causes the nonuniformity of display and therefore is not preferable.

In order to eliminate the above problem, a quartz substrate or a specified glass substrate that withstands a heat treatment at a high temperature may be used as a substrate. However, the quartz substrate or the specified glass substrate that withstands a high temperature is expensive and therefore difficult to use from the viewpoint of the production costs.

Also, there has been known a technique in which an amorphous silicon film is crystallized by the irradiation of a laser beam. In case of utilizing the irradiation of a laser beam, a crystalline silicon film which is partially very excellent in crystalline property can be obtained, whereas there arise such problems that it is hard to obtain the uniformity of the effect of irradiation of a laser beam over the entire film, and also that even the crystalline silicon films as obtained are increased in dispersion every process (in other words, low in reproducibility).

SUMMARY OF THE INVENTION

The present invention has been made in view of the above, and therefore an object of the invention is to obtain a crystalline silicon film on a glass substrate or a substrate having an insulating surface at a relatively low temperature (this temperature means, for example, a temperature which is withstood by the glass substrate).

Another object of the present invention is to obtain a crystalline silicon film which is capable of constituting a thin-film transistor of a peripheral drive circuit in an active matrix liquid-crystal display unit at a process temperature of a relatively low temperature.

In order to solve the above problem, according to one aspect of the present invention, there is provided a method of manufacturing a semiconductor device, which comprises the steps of:

forming an amorphous silicon film on a substrate having an insulating surface;

processing said amorphous silicon film by plasma of a gas that mainly contains hydrogen or helium; and giving an energy to said amorphous silicon film.

Also, according to the present invention, there is provided a method of manufacturing a semiconductor device, which comprises the steps of:

forming an amorphous silicon film on a substrate having an insulating surface;

processing said amorphous silicon film by plasma of a gas that mainly contains hydrogen or helium to form an unpaired binding bond of silicon; and giving an energy to said amorphous silicon film to crystallize said amorphous silicon film.

Also, according to the present invention, there is provided a method of manufacturing a semiconductor device, which comprises the steps of:

forming an amorphous silicon film on a substrate having an insulating surface;

processing said amorphous silicon film by plasma of a gas that mainly contains hydrogen to degasify hydrogen in said amorphous silicon film by hydrogen in plasma; and giving an energy to said amorphous silicon film to crystallize said amorphous silicon film.

Also, according to the present invention, there is provided a method of manufacturing a semiconductor device, which comprises the steps of:

forming an amorphous silicon film on a substrate having an insulating surface;

processing said amorphous silicon film by plasma of a gas that mainly contains helium and cutting off the binding of silicon and hydrogen in said amorphous silicon film by helium atoms which are ionized in said plasma to promote the elimination of hydrogen from said amorphous silicon film; and giving an energy to said amorphous silicon film to crystallize said amorphous silicon film.

According to another aspect of the present invention, there is provided a method of manufacturing a semiconductor device, which comprises the steps of:

forming an amorphous silicon film on a substrate having an insulating surface;

holding a metal element that promotes the crystallization of silicon in contact with the surface of said amorphous silicon film;

processing said amorphous silicon film by plasma of a gas that mainly contains hydrogen or helium; and giving an energy to said amorphous silicon film.

According to the present invention, there is provided a method of manufacturing a semiconductor device, which comprises the steps of:

forming an amorphous silicon film on a substrate having an insulating surface;

holding a metal element that promotes the crystallization of silicon in contact with the surface of said amorphous silicon film;

processing said amorphous silicon film by plasma of a gas that mainly contains hydrogen or helium to form an unpaired binding bond of silicon; and giving an energy to said amorphous silicon film to crystallize said amorphous silicon film.

According to the present invention, there is provided a method of manufacturing a semiconductor device, which comprises the steps of:

forming an amorphous silicon film on a substrate having an insulating surface;

holding a metal element that promotes the crystallization of silicon in contact with the surface of said amorphous silicon film;

processing said amorphous silicon film by plasma of a gas that mainly contains hydrogen to degasify hydrogen in said amorphous silicon film by hydrogen in plasma; and giving an energy to said amorphous silicon film to crystallize said amorphous silicon film.

According to the present invention, there is provided a method of manufacturing a semiconductor device, which comprises the steps of:

forming an amorphous silicon film on a substrate having an insulating surface;

holding a metal element that promotes the crystallization of silicon in contact with the surface of said amorphous silicon film;

processing said amorphous silicon film by plasma of a gas that mainly contains helium and cutting off the binding of silicon and hydrogen in said amorphous silicon film by helium atoms which are ionized in said plasma to promote the elimination of hydrogen from said amorphous silicon film; and giving an energy to said amorphous silicon film to crystallize said amorphous silicon film.

In the present invention, a glass substrate or a quartz substrate can be used as a substrate having an insulating surface. In general, the glass substrate is used from the viewpoint of economics.

One of methods of generating plasma of hydrogen or helium is a method using the ECR (electron cyclotron resonance) condition. Also, a parallel plane type plasma generating device which is frequently used in general can be also used. Further, other methods may be used for generating plasma. What is important is to utilize means for generating plasma a density of which is as high as possible.

The reason why plasma of hydrogen or helium is used is as follows. The reason why plasma is used is to eliminate hydrogen in the silicon film. In case of using hydrogen plasma, the active seed of hydrogen ions or hydrogen atoms in plasma is coupled with hydrogen in the silicon film into a hydrogen molecule, with the result that dehydrogenation progresses. Also, in case of using helium plasma, the binding of silicon and hydrogen is cut off by an ionization energy which is high in helium plasma, to thereby promote the elimination of hydrogen from the silicon film. For achieving such an object, it is preferable that the density of plasma is as high as possible. Also, in order to promote the elimination of hydrogen, it is useful to conduct a heat treatment during the plasma processing.

As a silicon film which is subjected to the plasma processing, the use of amorphous silicon can obtain the highest effect. This is because hydrogen of 20 to 30 atms % is contained in the amorphous silicon film.

In general, in case of using a glass substrate, an energy given to the amorphous silicon film is given by heating at a temperature of from 350° C. or higher, preferably 400° C. to a strain point of said glass substrate. Also, the upper limit of the heating temperature is of a temperature which can be withstood by a glass substrate (this temperature is generally given by the strain point of the glass substrate) or less, and may be of a temperature at which silicon is crystallized. The temperature at which silicon is crystallized is about 550 to 600° C. although being different depending on the density of impurities or the film forming method.

Also, in case of using the glass substrate as a substrate, an energy given to the amorphous silicon film is given by heating at a temperature of from about 350° C., preferably 400° C. to a strain point of said glass substrate.

Also, it is effective to give an energy to the amorphous silicon film by the irradiation of a laser beam or an intense light beam in addition to the above heating method.

Moreover, in case of using the glass substrate as a substrate, an energy may be given to the amorphous silicon film by alternately conducting heating at a temperature of the strain point of the glass substrate or lower, and the irradiation of a laser beam by one or a plurality of times.

Furthermore, in a method of manufacturing a semiconductor device in accordance with the present invention, the amorphous silicon film is-patterned to first form a region which will come to a seed later and to further form the seed of crystal growth by conducting crystallization due to the plasma processing and the application of an energy.

Therefore, according to the present invention, there is provided a method of manufacturing a semiconductor device, which comprises the steps of:
  forming a first silicon film on a substrate having an insulating surface;
  exposing said first silicon film to plasma of hydrogen or plasma of helium;
  crystallizing said first silicon film by giving an energy to said first silicon film;
  patterning said first silicon film which has been crystallized to form a seed of crystal growth;
  forming a second silicon film by covering said seed of crystal growth;
  exposing said second silicon film to plasma of hydrogen or plasma of helium; and
  giving an energy to said second silicon film to crystallize said second silicon film.

According to still another aspect of the present invention, there is provided a method of manufacturing a semiconductor device, comprising the steps of:
  forming a first silicon film on a substrate having an insulating surface;
  holding a metal element that promotes the crystallization of silicon in contact with said first silicon film before or after said forming step;
  exposing said first silicon film to plasma of hydrogen or plasma of helium;
  giving an energy to said first silicon film to crystallize said first silicon film;
  patterning said first silicon film which has been crystallized to form a seed of crystal growth;
  forming a second silicon film by covering said seed of crystal growth;
  exposing said second silicon film to plasma of hydrogen or plasma of helium; and
  giving an energy to said second silicon film to crystallize said second silicon film.

One of methods of generating plasma of hydrogen or helium is a method using the ECR condition. Also, a parallel plane type plasma generating device which is frequently used in general can be also used. Further, other methods may be used for generating plasma. What is important is to utilize means for generating plasma a density of which is as high as possible. With such means, the elimination of hydrogen in the amorphous silicon film is promoted.

In particular, in order to promote the elimination of hydrogen, it is useful to conduct a heat treatment during the plasma processing. The heat treatment is preferably conducted at a temperature of from 400° C. to a strain point of the glass substrate. Also, it may be a temperature of from 400° C. to the crystallization temperature of the amorphous silicon film (in general, 600° C. or lower).

As a silicon film which is subjected to the plasma processing, the use of amorphous silicon can obtain the highest effect. This is because hydrogen of 20 to 30 atms % is contained in the amorphous silicon film.

As a method of giving an energy to the silicon film in the above-mentioned structure, there are a heating method and a method of irradiating a laser beam while heating. In particular, the method of irradiating a laser beam while heating is very effective. This is because an instantaneous crystal growth due to the irradiation of a laser beam progresses. Also, although the irradiation of a laser beam may be replaced by the irradiation of an intense light beam, it cannot obtain the effect comparable to that of the irradiation of a laser beam. Furthermore, a heating may be further conducted after the irradiation of a laser beam while heating. The irradiation of a laser beam and a heating may be alternately conducted while heating. The heating after the irradiation of a laser beam has such an effect that point defects in the film are reduced.

A heating temperature at the time of giving an energy to the silicon film need be set to a strain point of the glass substrate, or less. This is because to restrain the deformation of the glass substrate.

For a metal element that promotes the crystallization of silicon, one kind of element or plural kinds of elements which are selected from Fe, Co, Ni, Ru, Rh, Pd, Os, Ir, Pt, Cu, Ag and Au can be used. In particular, it is useful to utilize an Ni element.

One method of holding the above metal element in contact with a silicon film is of a method of holding a film containing the above metal in contact with a silicon film. Also, one method of readily controlling the density of the above metal element is of a method coating a solution containing the above metal element therein on a silicon film. According to this method, the density of the metal element in the solution is adjusted to thereby readily control the density of the above metal elements that finally remain in the silicon film.

According to the present invention, there is provided a method of manufacturing a semiconductor device, which comprises the steps of:
  forming a first silicon film on a substrate having an insulating surface;
  eliminating hydrogen from said first silicon film;
  giving an energy to said first silicon film to crystalize said first silicon film;
  patterning said first silicon film which has been crystallized to form a seed of crystal growth;
  covering said seed of crystal growth to form a second silicon film;
  eliminating hydrogen in said second silicon film; and
  giving an energy to said second silicon film to crystallize said second silicon film.

According to the present invention, there is provided a method of manufacturing a semiconductor device, which comprises the steps of:
  forming a first silicon film on a substrate having an insulating surface;
  eliminating hydrogen from said first silicon film;
  holding a metal element that promotes the crystallization of silicon in contact with said first silicon film before or after said forming step;

giving an energy to said first silicon film to crystalize said first silicon film;

patterning said first silicon film which has been crystallized to form a seed of crystal growth;

covering said seed of crystal growth to form a second silicon film;

eliminating hydrogen in said second silicon film; and giving an energy to said second silicon film to crystallize said second silicon film.

According to the present invention, there is provided a method of manufacturing a semiconductor device, which comprises the steps of:

forming a first silicon film on a substrate having an insulating surface;

patterning said first silicon film which has been crystallized to form a seed of crystal growth;

dehydrogenating hydrogen in said seed;

giving an energy to said seed to crystallize said seed;

coating said seed to form a second silicon film;

dehydrogenating hydrogen in said second silicon film; and giving an energy to said second silicon film to crystallize said second silicon film.

According to the present invention, there is provided a method of manufacturing a semiconductor device, which comprises the steps of:

forming a first silicon film on a substrate having an insulating surface;

dehydrogenating hydrogen in said first silicon film;

patterning said first silicon film to form a seed of crystal growth;

giving an energy to said seed to crystallize said seed;

coating said seed to form a second silicon film;

dehydrogenating hydrogen in said second silicon film; and giving an energy to said second silicon film to crystallize said second silicon film.

According to the present invention, there is provided a method of manufacturing a semiconductor device, which comprises the steps of:

forming a first silicon film on a substrate having an insulating surface;

dehydrogenating hydrogen in said first silicon film;

patterning said first silicon film to form a seed of crystal growth;

holding a metal element that promotes the crystallization of silicon in contact with said first silicon film before or after said forming step;

giving an energy to said seed to crystallize said seed;

coating said seed to form a second silicon film;

dehydrogenating hydrogen in said second silicon film; and giving an energy to said second silicon film to crystallize said second silicon film.

In the present invention, the crystal growth from the seed of the crystal growth allows a monocrystal-like region or a substantially monocrystal-like region to be formed. In particular, the crystal growth from the seed of the crystal growth based on the first silicon film allows a monocrystal-like region or a substantially monocrystal-like region to be formed in the second silicon film.

The monocrystal-like region or the substantially monocrystal-like region is defined as a region that satisfies such conditions that it has substantially no grain boundary; it contains hydrogen or halogen elements therein; it contains carbon atoms and nitrogen atoms at a density of $1\times10^{16}$ to $5\times10^{18}$ atms cm$^{-3}$ therein; and it contains oxygen atoms at a density of $1\times10^{17}$ to $5\times10^{19}$ atms cm$^{-3}$ therein.

It should be noted that the density of those elements is defined as a minimum value which is measured by the SIMS (secondary ion measuring system).

The above-mentioned conditions result from an amorphous silicon film which has been formed through the vapor phase technique or the like as a starting film. Also, the inclusion of hydrogen or halogen elements results from the amorphous silicon film which has been formed through the vapor phase technique or the like as a starting film, likewise. In other words, the monocrystal-like region or the substantially monocrystal like region contains hydrogen or halogen elements for compensating the point defects which are caused to be formed in the film. For example, in case of containing hydrogen, its density becomes 0.0001 to 5 atms %.

According to another aspect of the present invention, there is provided a method of manufacturing a semiconductor device, which comprises the steps of:

providing a plurality of groups having a semiconductor region on the same substrate having an insulating surface;

forming one or a plurality of said semiconductor regions in said group; and forming said semiconductor region mainly by the monocrystal-like or the substantially monocrystal region;

wherein, between one of said plurality of groups and other groups, main crystal axes in said monocrystal-like or substantially monocrystal-like region are substantial identical to each other, and rotating angles with said crystal axes as a center are different from each other.

According to the present invention, there is provided a method of manufacturing a semiconductor device, which comprises the steps of:

providing a plurality of groups having a semiconductor region on the same substrate having an insulating surface;

forming one or a plurality of said semiconductor regions in said group; and forming said semiconductor region mainly by the monocrystal-like or the substantially monocrystal region;

wherein, between one of said plurality of groups and other groups, main crystal axes in said monocrystal-like or substantially monocrystal-like region are substantial identical to each other, and rotating angles with said crystal axes as a center are different from each other; and wherein said semiconductor region contains metal elements that promotes the crystallization of silicon at a density of $1\times10^{14}$ to $3\times10^{18}$ atms cm$^{-3}$ therein.

A specified example with the above-mentioned structure is shown in FIG. 9. What is shown in FIG. 9 is an example in which four monocrystal-like or substantially monocrystal-like regions are formed by crystal growth from four crystal seeds which are indicated by reference numerals 600, 602, 606 and 609. In FIG. 9, reference numerals 604 and 611 denote the monocrystal-like or substantially monocrystal-like regions. Also, reference numeral 601 denotes a boundary portion at a top of crystal growth, and reference numeral 603 denotes a grain boundary which is formed by making crystal growth collide with each other.

Reference numerals 605 and 607 denote island-like semiconductor regions which are obtained by patterning the monocrystal-like or substantially monocrystal-like region obtained by crystal growth from seed crystal.

In FIG. 9, one group is constituted by semiconductor regions 605 and 607 which are constituted using a region that grows from the crystal seed 606. In the group, the crystal axes are substantially identical to each other. Also, rotating angles with their crystal axes as a center are substantially identical to each other. This results from growth from the same crystal seed.

Hereinafter, the concept of a crystal axis and a concept of rotation with its crystal axis as a center will be described. What is shown in FIG. 8 is a crystal axis 501 of a monocrystal-like region or substantially monocrystal-like region 503. The crystal axis 501 has, for example, a value of an axial orientation <111> or an axial orientation <100>.

The identity of a crystal axis is defined as an angle of its deviation being within ±10°. Also, the identity of a rotating angle around the crystal axis is defined as being within ±10° with a reference of a specified angle.

In general, a plurality of monocrystal-like regions or substantially monocrystal-like regions formed on the same substrate using the same forming method commonly have the same crystal axis.

Hereinafter, this phenomenon will be described with reference to an example shown in FIG. 9. First, crystal seeds 600, 602, 606 and 609 are obtained from one starting film as shown by its manufacturing process in FIG. 5. In one film, the orientations of crystal axes are substantially identical to each other. It should be noted that the orientation of crystal axis is not limited by or to the above description in a fine crystal state where one crystal grain is small.

Then, the monocrystal-like regions or substantially monocrystal-like regions that have grown from seeds having the same crystal axis also commonly have the same crystal axis. Hence, the four monocrystal-like regions and substantially monocrystal-like regions shown in FIG. 9 are identical in crystal axis.

On the other hand, the crystal seeds 600, 602, 606 and 609 are obtained from different crystal grains, that is, different monocrystal-like regions or substantially monocrystal-like regions. In this case, since those crystal seeds are obtained from the same starting film, they commonly have the same crystal axis (501 in FIG. 8). However, its crystal structure as obtained is such that a crystal grain rotates with the crystal axis 501 as a center in an orientation indicated by reference numeral 502. It is needless to say that although crystal seeds having the same rotating orientation are obtained by accident, the rotating angle in an orientation indicated by reference numeral 502 is generally different depending on the crystal grain.

This is understandable from the fact that the grain boundary is not formed in principle in the case where the respective crystal grains commonly have the same crystal axis 501, and the rotating angles indicated by reference numeral 502 are identical to each other.

Also, the reason why a silicon film consisting of a large number of crystal grains (one crystal grain is regarded as a monocrystal) can be generally obtained is considered to be a result from the fact that, in the respective crystal grains, although the crystal axes are identical to each other (this can be recognized by the x-ray diffraction or the electron ray diffraction), the rotating angles are different as indicated by reference numeral 502 in FIG. 8 with its crystal axis as a center.

It should be noted that, in a stated shown in FIG. 9, even though the crystal axes of the crystal seeds 606 and 609 are identical to each other and the rotating angles with their axes as a center are identical to each other, a grain boundary shown in reference numeral 603 is actually caused to be formed with some difference. This is because oxygen, carbon and further a small amount of metal exist in an amorphous silicon film which has been formed through the vapor phase technique, and those impurities are deposited at a top of crystal growth.

In a state shown in FIG. 9, the semiconductor regions 605 and 607 constitute one group, and the semiconductor regions 608 and 610 constitute another group. In those groups, although their crystal axes (as defined in FIG. 8) are identical or substantially identical to each other, the rotating directions of their crystal axes (as defined by reference numeral 502 in FIG. 8) are different from each other.

It should be noted that, if the crystal seeds 606 and 609 are obtained from the same monocrystal-like region or substantially monocrystal-like region, not only the crystal axes of those two groups but also their rotating angles are identical to each other.

Also, the monocrystal-like region or substantially monocrystal-like region contains metal elements that Promote the crystallization of silicon at a density of $1 \times 10^{14}$ to $3 \times 10^{18}$ atms cm$^{-3}$ therein. Also, the range of density has a mean value of $1 \times 10^{15}$ to $3 \times 10^{19}$ atms cm$^{-3}$. Those densities are obtained through SIMS (secondary ion measuring system) or obtained on the basis of their data.

In general, in the measurement of a metal density through the SIMS, it is hard to measure the order of $10^{14}$ cm$^{-3}$. However, the density of metal elements in the monocrystal-like regions or the substantially monocrystal-like regions 307 and 308 can be estimated in the order of $10^{14}$ cm$^{-3}$ from a relationship between the density of the metal elements contained in the seed crystal 304 and the density of metal elements in the semiconductor regions 307 and 308 obtained by crystal growth from the seed crystal 304 in FIG. 5.

According to the present invention, there is provided a method of manufacturing a semiconductor device, which comprises the steps of:

providing a plurality of groups having a semiconductor region on the same substrate having an insulating surface;

forming a plurality of said semiconductor regions in said groups; and forming said semiconductor region mainly by a monocrystal-like or substantially monocrystal-like region;

wherein, between one of said plurality of groups and other groups, main crystal axes in said monocrystal-like or substantially monocrystal-like regions are substantially identical to each other, and rotating angles with said crystal axes as a center are different from each other; and wherein, in one of said plurality of groups, main crystal axes in said monocrystal-like or substantially monocrystal-like regions in said plurality of semiconductor regions are substantially identical to each other, and rotating angles with said crystal axes as a center are identical to each other.

According to the present invention, there is provided a method of manufacturing a semiconductor device, which comprises the steps of:

providing a plurality of groups having a semiconductor region on the same substrate having an insulating surface;

forming a plurality of said semiconductor regions in said groups; and forming said semiconductor region mainly by a monocrystal-like or substantially monocrystal-like region;

wherein, between one of said plurality of groups and other groups, main crystal axes in said monocrystal-like or substantially monocrystal-like regions are substantially identical to each other, and rotating angles with said crystal axes as a center are different from each other;

wherein, in one of said plurality of groups, main crystal axes in said monocrystal-like or substantially monocrystal-like regions in said plurality of semiconductor regions are substantially identical to each other, and rotating angles with said crystal axes as a center are identical to each other; and wherein said semiconductor region contains metal elements that promote the crystallization of silicon at a density of $1 \times 10^{14}$ to $3 \times 10^{18}$ atms cm$^{-3}$ therein.

A specified example with the above-mentioned structure is shown in FIG. 9. In FIG. 9, a pair of semiconductor regions constituted by four monocrystal-like regions or substantially monocrystal-like regions, which have grown from seed crystals 602, 600, 606 and 609 are formed on the same substrate. Those semiconductor regions are indicated by reference numerals 605 and 607.

The pair of semiconductor regions constitute one group. For example, the semiconductor regions 605 and 607 constitute one group whereas the semiconductor regions 608 and 610 constitute the other group.

In a relationship between those two groups, main crystal axes are substantially identical to each other, but their rotating angles are different from each other. Also, the semiconductor regions 605 and 607 in one group commonly have the same crystal axis and the substantially same rotating angle with their crystal axis as a center.

The semiconductor regions 605 and 607 are constituted by the monocrystal-like or substantially monocrystal-like regions.

Further, in order to obtain a crystalline silicon film with an excellent reproducibility, according to the present invention, there is provided a device for manufacturing a semiconductor device, which comprises:

a first airtight chamber for subjecting an amorphous silicon film formed on a substrate having an insulating surface to a plasma processing to eliminate hydrogen in the amorphous silicon film;

a second airtight chamber having means for irradiating a laser beam to said silicon film; and a third airtight chamber commonly connected to said first airtight chamber and said second airtight chamber, for transporting said substrate.

A structural example of a specified semiconductor device having the above-mentioned structure is shown in FIG. 12. In the structure shown in FIG. 12, reference numeral 902 corresponds to the first airtight chamber in the above-mention ed structure. The airtight chamber indicated by reference numeral 902 is a chamber for subjecting an amorphous silicon film formed on a substrate to a plasma processing through ECR plasma in a state the amorphous silicon film is isolated from an external. This plasma processing is conducted to eliminate hydrogen in the silicon film as much as possible to realize a state in which crystallization is liable to progress.

Reference numeral 904 corresponds to the second airtight chamber. In this chamber, a step of crystallizing the silicon film which has been subjected to the plasma processing in advance is conducted by the irradiation of a laser beam while heating.

Reference numeral 905 corresponds to the third airtight chamber in the above-mentioned structure. This airtight chamber is provided with a robot arm 922, and has a function of transporting a substrate to be processed in atmosphere (preferably in a high vacuum state) which is isolated from the external.

It should be noted that, in the present invention, it is normal to use a glass substrate as a substrate. However, a semiconductor substrate, a metal substrate or the like may be used.

According to the present invention, there is provided a device for manufacturing a semiconductor device, which comprises:

a first airtight chamber having means for forming an insulating film on a substrate having an insulating surface;

a second airtight chamber having means for forming an amorphous silicon film;

a third airtight chamber for subjecting the amorphous silicon film to a plasma processing to eliminate hydrogen in the amorphous silicon film;

a fourth airtight chamber having means for heating; and a fifth airtight chamber commonly connected to said first to fourth airtight chambers, for transporting said substrate.

A specified example C in the above-mentioned structure is shown in FIG. 15. In the structure shown in FIG. 15, reference numeral 1002 corresponds to the first airtight chamber in the above-mentioned structure. This airtight chamber has a function of forming a silicon oxide film on a glass substrate through the plasma CVD technique. It should be noted that a silicon nitride film or an oxidized silicon nitride film may be formed for the insulating film, except for the silicon oxide film.

In the structure shown in FIG. 15, reference numeral 1003 corresponds to the above-mentioned second airtight chamber. This airtight chamber has the fore-mentioned function through the plasma CVD technique.

In the structure shown in FIG. 15, reference numeral 1004 corresponds to the above-mentioned third airtight chamber. This airtight chamber has a function of subjecting an amorphous silicon film on a silicon oxide film which has been formed in the second airtight chamber 1003 in advance to a plasma processing through ECR plasma.

In the structure shown in FIG. 15, reference numerals 1005 and 1006 correspond to the above-mentioned fourth airtight chambers. The airtight chambers have a function of crystallizing the silicon film which has been subjected to the plasma processing in the third airtight chamber 1004 in advance, by heating in a state where the silicon film is isolated from the external.

According to the present invention, there is provided a method of manufacturing a semiconductor device, which comprises the steps of:

subjecting an amorphous silicon film formed on a substrate having an insulating surface to a plasma processing to eliminate hydrogen in the amorphous silicon film; and giving an energy to said silicon film to change said silicon film into a crystalline silicon film;

wherein said two steps are conducted in a space which is isolated from an external and has an airtightness.

In the above-mentioned structure, as a method of giving an energy, there are a method of irradiating a laser beam, a method of heating, a method of using a laser beam and a heating together, and a method of alternately conducting the irradiation of a laser beam and a heating.

The amorphous silicon film which has been formed through the vapor phase technique is exposed to hydrogen plasma or helium plasma, thereby being capable of eliminating hydrogen coupled to silicon in the amorphous silicon film to the exterior. Then, the rate of binding silicon to each other is increased so that silicon can be changed from an amorphous silicon state to a quasi-crystalline state. This state is a state where there exist a large amount of binding of silicon atoms exist, and also there exists binding of silicon atoms to each other in a very small level. Then, silicon in the quasi-crystalline state can be readily crystallized by the application of a thermal energy or laser light energy.

The crystalline silicon film which has been crystallized by this technique can partially form a monocrystal-like region or substantially monocrystal-like region.

Furthermore, in the present invention, the amorphous silicon film is patterned and crystallized, thereby being capable of forming the monocrystal-like region or substantially monocrystal-like region as a seed. Then, an amorphous silicon film is again formed and dehydrogenated through another plasma processing. In this process, the amorphous silicon film comes into a state where it is liable to be crystallized (quasi-crystalline state). Crystal growth can be made from the above-mentioned seed by the application of a thermal energy or a light energy such as a laser beam. In this situation, the crystal growth progresses from a portion of the above-mentioned monocrystal-like seed or the substantially monocrystal-like seed so that a predetermined region of the amorphous silicon film can be changed into monocrystal or a monocrystal-like region.

Also, the amorphous silicon film is so patterned as to first form a region which will form a seed later. Then, the amorphous silicon film may be subjected to a plasma processing and the application of an energy so as to be crystallized, to thereby form a seed of crystal growth. In this case, since the amorphous silicon film is patterned into fine regions before being subjected to a dehydrogenating process and a crystallizing process, their interiors can more effectively form the monocrystal-like seed or the substantially monocrystal-like seed.

In particular, with the use of a metal element that promotes the crystallization of silicon, their interior readily can form the monocrystal-like seed or the substantially monocrystal-like seed.

What is particularly useful for the present invention is that a seed portion can be selectively formed on a required region. Then, crystal growth is conducted from that seed, whereby the monocrystal-like region or the substantially monocrystal-like region can be formed in the required region.

Utilizing this feature, a thin-film transistor or other thin-film semiconductor devices utilizing the monocrystal-like region or the substantially monocrystal-like region can be formed on a required region.

Also, in the device for manufacturing the semiconductor device in accordance with the present invention, a plasma processing step of promoting the elimination of hydrogen from the amorphous silicon film which is formed on the substrate having an insulating surface, and a step of changing the amorphous silicon film into a crystalline silicon film by the application of an energy after the above step has been conducted, are continuously conducted in a space which is isolated from the exterior without being in contact with air or contaminated atmosphere, thereby being capable of removing an influence of an external factor in the steps for obtaining the crystalline silicon film.

As described above, with the promotion of the elimination of hydrogen from the amorphous silicon film, the binding of silicon to each other in the amorphous silicon film can be promoted, thereby being capable of more enhancing the degree of order of a crystal structure.

However, this state is very unstable and very sensitive to the external factor which is represented by contamination.

Therefore, as described above, the plasma processing step and the subsequent crystallizing step are continuously conducted, thereby being capable of realizing a process that removes the above-mentioned external factor and which is high in reproducibility.

Also, the formation of the amorphous silicon film, a process of promoting the elimination of hydrogen from the amorphous silicon film, and the crystallization of the silicon film from which the elimination of hydrogen is promoted are continuously conducted in a space which is isolated from the external, thereby being capable of restraining the dispersion (the nonuniformity of a crystalline property and the dispersion of the electric characteristic) in the crystallizing process, which is caused by the external factor.

Further, a processing chamber in which the elimination of hydrogen from the amorphous silicon film is promoted, and a processing chamber in which the silicon film from which the elimination of hydrogen has been promoted is crystallized are coupled to a transportation chamber for transporting a substrate, and the above processing and the transportation of the substrate are conducted in a state where it is isolated from the external, thereby being capable of obtaining constant processing effects with respect to a plurality of substrates. In other words, the crystalline silicon film which is uniform in crystalline property for each substrate can be obtained. Further, a high productivity can be obtained.

The above and other objects and features of the present invention will be more apparent from the following description taken in conjunction with the accompanying drawings.

DETAILED DESCRIPTION OF THE PREFERRED EMBODIMENTS

Now, a description will be given in more detail of embodiments of the present invention with reference to the accompanying drawings.

First Embodiment

A first embodiment relates to a structure in which a crystalline silicon film is formed on a glass substrate. First, a silicon oxide film is formed on a glass substrate as an under layer. The silicon oxide film functions to relieve the diffusion of impurities in the glass substrate and a stress produced between the glass substrate and a semiconductor film. The silicon oxide film may be formed at a thickness of about 3000 Å through the plasma CVD technique or the sputtering technique.

Then, an amorphous silicon film is formed on the silicon oxide film. The amorphous silicon film may be formed through the plasma CVD technique or the decompression thermal CVD technique. The thickness of the amorphous silicon film may be set to a required value, but is set to 500 Å in this embodiment.

After the formation of the amorphous silicon film, a hydrogen plasma is produced under decompression through a technique using a magnetic field and a microwave, and the above-mentioned amorphous silicon film formed on the glass substrate is subjected to a plasma processing through the plasma. In this example, a hydrogen gas is changed into plasma under the ECR condition.

Figure 1:
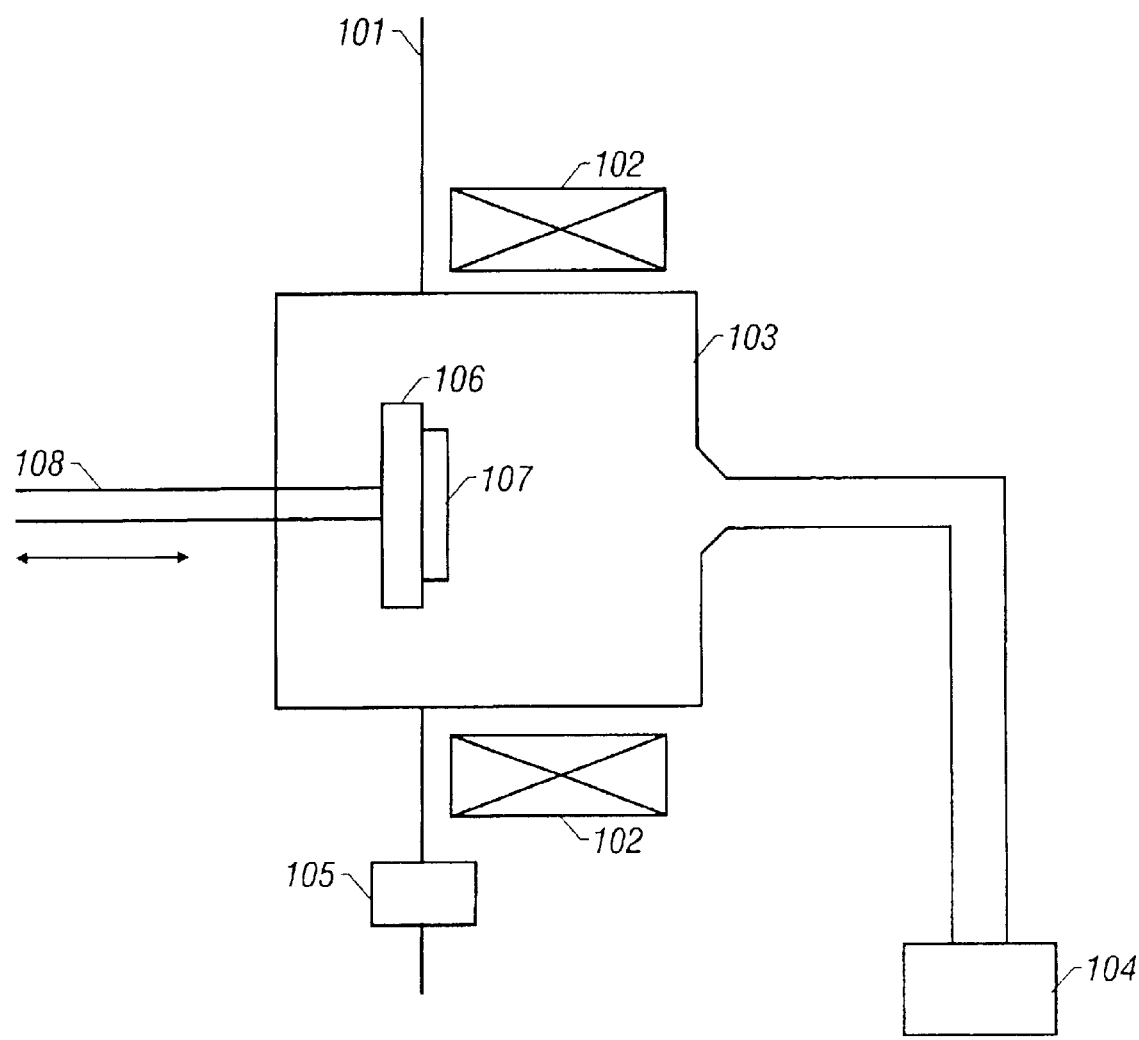
FIG. 1 is a schematic diagram showing a device for processing a plasma processing.

FIG. 1 shows an outline of a device for generating the ECR condition. The device shown in FIG. 1 is a device for generating high-density plasma by forming the ECR condition in accordance with an interaction between a microwave of 2.45 GHz which is generated at an oscillator 104 and a magnetic field which is generated at a magnet 102.

For conducting a plasma processing, a substrate (sample) is first disposed on a substrate holder 106, and an exhaust pump 105 allows the interior of a chamber 103 to come into a predetermined decompression state. In this situation, a substrate position adjusting bar 108 is manipulated so that a substrate 107 is moved to a region that just satisfies the ECR condition. The intensity of the magnetic field at that position is 875 gauss that just satisfies the ECR condition by the interaction between the magnetic field and the microwave of 2.45 GHz. Also, during the plasma processing, the substrate 107 can be heated by a heater disposed within the substrate holder. Since hydrogen ions (or helium) are negative ions, hydrogen ions (or helium ions) can be drawn toward the substrate side from plasma by the application of a negative bias voltage to the substrate holder, thereby being capable of further enhancing the effect of a plasma processing.

Hydrogen which has been changed into plasma under the ECR condition is very high in plasma density. When the amorphous silicon film is exposed to such hydrogen plasma, hydrogen atoms in the amorphous silicon film is coupled to active hydrogen atoms in plasma, the hydrogen atoms in the amorphous silicon film is eliminated outside of the film.

With the elimination of hydrogen in the amorphous silicon film, such a state that the binding bonds of silicon are liable to be bound to each other can be realized. This state can be also regarded as a quasi-crystalline state, and is a state where crystallization is liable to remarkably progress by the application of an energy from the external.

During the above-mentioned plasma processing, it is very effective to heat a sample. The heating is effectively conducted at a temperature of 300 to 500° C. which is a temperature at which the amorphous silicon film is not crystallized.

After the plasma processing has been finished, a heat treatment is conducted on the amorphous silicon film, to thereby obtain a crystalline silicon film. This heat treatment is conducted at a temperature of from 400° C. to a strain point of the glass substrate for several to ten hours. In this example, a crystalline silicon film is obtained by conducting a heat treatment at a temperature of 550° C. for 5 hours. In this way, the crystalline silicon film can be obtained on the glass substrate.

Second Embodiment

A second embodiment relates to a structure in which a crystalline silicon film is formed on a glass substrate, using the catalysis of a metal element. First, a silicon oxide film is formed on a glass substrate as an under layer. The silicon oxide film functions to relieve the diffusion of impurities in the glass substrate and a stress produced between the glass substrate and a semiconductor film. The silicon oxide film may be formed at a thickness of about 3000 Å through the plasma CVD technique or the sputtering technique.

Then, an amorphous silicon film is formed on the silicon oxide film. The amorphous silicon film may be formed through the plasma CVD technique or the decompression thermal CVD technique. The thickness of the amorphous silicon film may be set to a required value, but is set to 500 Å in this embodiment.

After the formation of the amorphous silicon film, metal elements that promote the crystallization of silicon is held in contact with the surface of the amorphous silicon film. In this example, nickel is used as the metal elements. Then, nickel elements are introduced onto the surface of the amorphous silicon film using a nickel acetate solution which is a solution containing nickel therein. Also, a surface active agent is mixed with the nickel acetate solution in such a manner that nickel atoms are dispersed in the solution.

Specifically, a nickel acetate solution which is adjusted to a predetermined nickel density is coated on the surface of the amorphous silicon film, and an excessive solution is blown off by a spinner with the result that the nickel elements are held in contact with the surface of the amorphous silicon film.

In this way, in case of introducing the metal elements that promote the crystallization of silicon by using a solution, the density of the metal elements that finally remain in the silicon film is readily controlled. In other words, the density of the metal elements that remain in the silicon film after the crystallization has been finished can be determined by controlling the density of the metal elements in the solution. This is very important from the viewpoint that the existence of the metal elements impedes the semiconductor property of silicon.

As a result of observing a state in which the metal elements are held in contact with the surface of the amorphous silicon film, it has been found that the metal elements exist in a state where they are uniformly dispersed on the surface of the amorphous silicon film. The application of the plasma CVD technique or the sputtering technique makes it hard to form a very thin film. Hence, it is difficult to hold the metal elements so as to be uniformly dispersed.

It should be noted that the metal elements need to finally exist at a density of $1\times10^{15}$ to $5\times10^{15}$ atms cm$^{-3}$ in the silicon film. This is because the crystallization action cannot be obtained under the condition where the density is lower than the above range, and the semiconductor characteristic of silicon is lost under the condition where it is higher than the above range.

After the formation of the amorphous silicon film, a hydrogen plasma is produced under decompression through a technique using a magnetic field and a microwave, and the above-mentioned amorphous silicon film formed on the glass substrate is subjected to a plasma processing through the plasma. In this example, a hydrogen gas is changed into plasma under the ECR condition, using the ECR device shown in FIG. 1 as in the first embodiment.

Hydrogen which has been changed into plasma under the ECR condition is very high in plasma density. When the amorphous silicon film is exposed to such hydrogen plasma, hydrogen atoms in the amorphous silicon film is coupled to active hydrogen atoms in plasma, the hydrogen atoms in the amorphous silicon film is eliminated outside of the film.

With the elimination of hydrogen in the amorphous silicon film, such a state that the binding bond of silicon are liable to be bound to each other can be realized. This state can be also regarded as a quasi-crystalline state, and is a state where crystallization is liable to remarkably progress by the application of an energy from the external.

During the above-mentioned plasma processing, it is very effective to heat a sample. The heating is effectively conducted at a temperature of 300 to 500° C. which is a temperature at which the amorphous silicon film is not crystallized.

After the plasma processing has been finished, a heat treatment is conducted on the amorphous silicon film, to thereby obtain a crystalline silicon film. This heat treatment is conducted at a temperature of from 400° C. to a strain point of the glass substrate for several to ten hours. In this example, a crystalline silicon film is obtained by conducting a heat treatment at a temperature of 550° C. for 5 hours. In this way, the crystalline silicon film can be obtained on the glass substrate.

Third Embodiment

A third embodiment relates to a structure in which the order of a process of introducing the metal elements that promote the crystallization of silicon and a process of the plasma processing are reversed in the processes described in the second embodiment. In other words, a plasma processing is conducted after the formation of the amorphous silicon film, and thereafter a plasma processing is conducted on the silicon film which has been plasma processing. With those processes, the inside of a chamber for conducting the plasma processing can be prevented from being contaminated by the metal elements.

Fourth Embodiment

A fourth embodiment is characterized in that, in the structures described with reference to the first to third embodiments, a crystallization process after the plasma processing has been finished is conducted by a method in which heating and the irradiation of a laser beam are conducted together.

First, a plasma processing is conducted on an amorphous silicon film through a method described in the first or second embodiment. Alternatively, nickel elements (it is needless to say that other predetermined metal elements are also available) are introduced onto a silicon film which has been subjected to a plasma processing as described in the third embodiment.

Then, after the plasma processing has been finished, a laser beam is irradiated onto the amorphous silicon film while heating. The heating is conducted desirably at a temperature as high as possible, which is a strain point of the glass substrate or lower. For example, in case of using a Corning glass substrate as a glass substrate, an upper limit of the heating temperature is set to 593° C. This is because a strain point of the Corning Glass substrate is 593° C.

It is preferable to use a laser beam in an ultraviolet region. In this example, a KrF excimer laser (wavelength of 248 nm) is used. A laser beam may be replaced by an intense light beam.

With conducting the irradiation of a laser beam and heating together, a crystalline silicon film having a high crystalline property can be obtained. The crystalline silicon film obtained is uniform and excellent in reproducibility. This is because a rapid change in phase in accordance with the irradiation of a laser beam is relieved by conducting the heat treatment together.

Fifth Embodiment

A fifth embodiment is to conduct a plasma processing not through hydrogen plasma but through helium plasma in the structure described in the first or second embodiment.

A large amount of binding of silicon and hydrogen exist in the amorphous silicon film. This state is generally called a Si—H binding that has a relatively high binding force. In order to eliminate hydrogen from the amorphous silicon film, there is required an energy by which the Si—Hi binding is cut, and hydrogen atoms are drawn apart from silicon atoms.

This embodiment is characterized by using an energy of helium plasma as that energy. An ionization energy of helium is high, and its plasma has a large energy. Hence, using helium plasma, an energy can be supplied to hydrogen atoms which are coupled to silicon in the amorphous silicon film, as a result of which hydrogen atoms can be effectively eliminated from the inside of the amorphous silicon film.

Similarly, in this embodiment, the ECR condition is applied as a method of generating plasma. In the structure shown in this embodiment, it is very useful to conduct a heating at a temperature of 300 to 500° C. simultaneously during the helium plasma processing. With conducting the heating, hydrogen atoms are eliminated from silicon atoms to which hydrogen atoms are coupled, thereby being capable of promoting binding of silicon atoms together.

Sixth Embodiment

A sixth embodiment exhibits an example in which a thin-film transistor is manufactured using a crystalline silicon film which has been manufactured through a plasma processing in accordance with the present invention. First, a silicon oxide film 202 that functions as an under layer and has a thickness of 3000 Å is formed on a glass substrate 201 through the sputtering technique. Then, an amorphous silicon film 203 having a thickness of 500 Å is formed on the silicon oxide film 202 through the plasma CVD technique or the decompression thermal CVD technique.

Figure 2A:
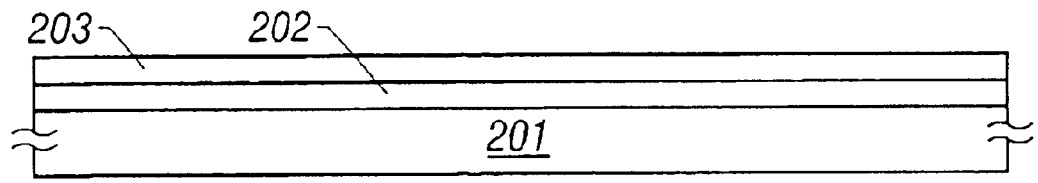
FIGS. 2A to 2D are diagrams showing a process of manufacturing a thin-film transistor.

Then, using the device shown in FIG. 1, a plasma processing is conducted on the amorphous silicon film 203. In this example, helium is used as a gas. In the plasma processing, the glass substrate in a state shown in FIG. 2A is disposed at a portion, which is indicated by reference numeral 107, of the device shown in FIG. 1.

It should be noted that the position of the substrate is adjusted by manipulating an adjusting bar 108 in such a manner that the ECR condition is just satisfied at the position of the substrate. The plasma processing is conducted in a state where the substrate is heated at a temperature of 400° C. It should be noted that the heating is conducted by a heater installed within a substrate holder 106.

Figure 2B:
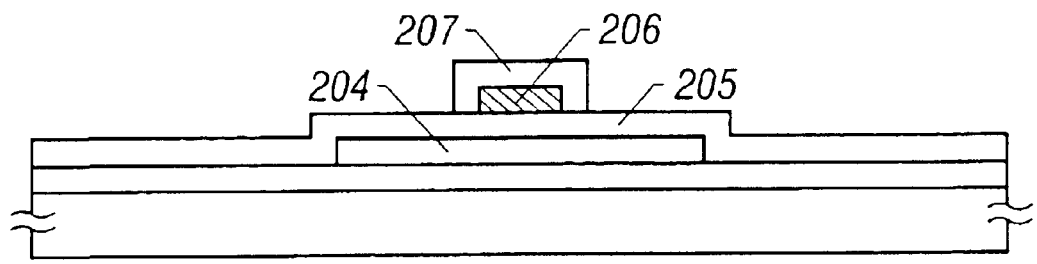

After the plasma processing has been conducted, a heat treatment at 550° C. for 5 hours is conducted in the nitrogen atmosphere, to thereby crystallize the amorphous silicon film 203. Then, the substrate is taken out from the device shown in FIG. 1, and an active layer of a thin-film transistor is formed by patterning. In this way, the active layer 204 of the thin-film transistor is formed (FIG. 2B).

Subsequently, a silicon oxide film 205 that functions as a gate insulating film and has a thickness of 1000 Å is formed on the surface through the plasma CVD technique or the sputtering technique. Thereafter, a film that mainly contains aluminum for constituting a gate electrode and has a thickness of 6000 Å is formed on the silicon oxide film 205. The film forming method may be of the sputtering technique or the electron beam vapor deposition technique. Then, a gate electrode 206 is formed by patterning. Furthermore, anodic oxidation is conducted with the gate electrode 206 as an anode in the electrolyte, to thereby form an anodic oxide layer 207 around the gate electrode 206. The thickness of the anodic oxide layer is set to 2000 Å. In this way, a state shown in FIG. 2B is obtained.

Subsequently, impurity ions for the formation of source and drain regions are accelerated and implanted through the ion implantation technique or the plasma doping technique. In this process, impurity ions are implanted in regions 208 and 211 with the gate electrode 206 and the peripheral anodic oxide layer 207 as a mask. In this example, p (phosphorus) ions are implanted for manufacturing an n-channel thin-film transistor. Impurity ions are not implanted in a region 209 with the anodic oxide layer 207 as a mask. Similarly, impurity ions are not implanted in a region 210 with the gate electrode 206 as a mask.

Figure 2C:
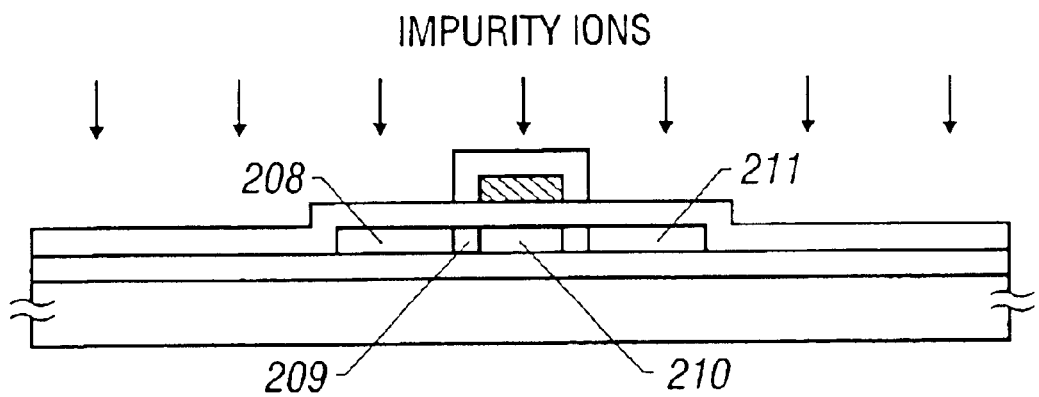

After the implantation of impurity ions, the activation of the implanted impurity ions and annealing of a region into which impurity ions are implanted are conducted by the irradiation of a laser beam. In this way, the source region 208 and the drain region 211 are formed in a self-alignment manner. Simultaneously, the region 209 forms an offset gate region, and the region 210 forms a channel formation region (FIG. 2C).

Figure 2D:
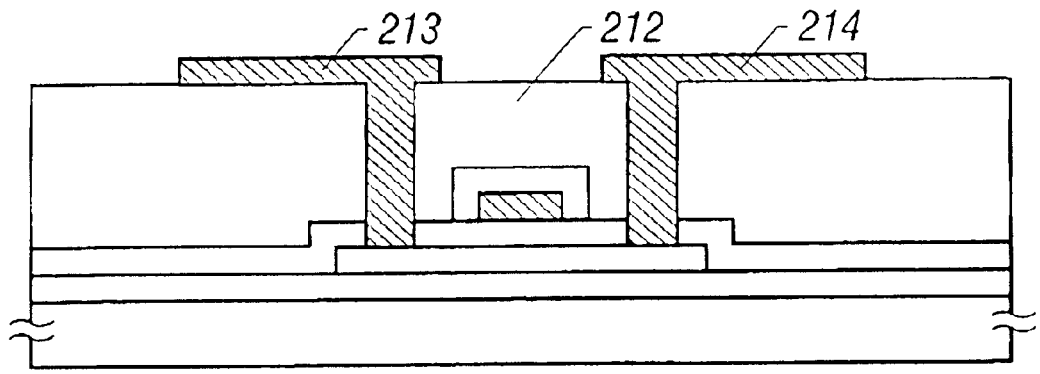

Subsequently, a silicon oxide film 212 having a thickness of 6000 Å is formed as an interlayer insulating film. The silicon oxide film 212 is formed through the plasma CVD technique. The, contact holes are formed for the formation of a source electrode 213 and a drain electrode 214. Furthermore, a heat treatment is conducted in the hydrogen atmosphere at 350° C. for one hour, to thereby complete a thin-film transistor shown in FIG. 2D.

Figure 4:
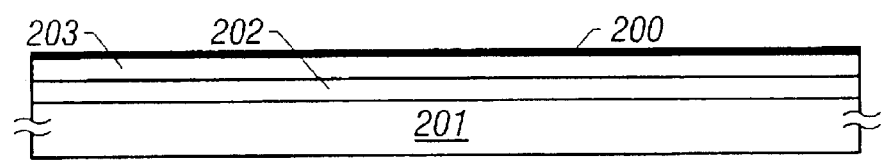
FIG. 4 is a diagram showing a process of manufacturing a thin-film transistor.

It should be noted that, in crystallizing the amorphous silicon film 203, a metal element that promotes the crystallization of the silicon film can be used. FIG. 4 shows a process for obtaining the crystalline silicon film using nickel elements. It should be noted that the same reference numerals as those in FIG. 2 are representative of like members.

First, a silicon oxide film 202 that functions as an under layer and has a thickness of 3000 Å is formed on a glass substrate 201 through the sputtering technique. Then, an amorphous silicon film 203 having a thickness of 500 Å is formed on the silicon oxide film 202 through the plasma CVD technique or the decompression thermal CVD technique. Nickel elements are held in contact with the surface of the amorphous silicon film 203, using a nickel acetate solution. In this example, the nickel acetate solution which is adjusted to a predetermined nickel density is coated on the surface of the amorphous silicon film, and an excessive solution is removed by a spinner with the result that the nickel elements are held in contact with the surface of the amorphous silicon film 203. The nickel elements held in contact with the surface of the amorphous silicon film 203 are held in a dispersed state. In FIG. 4, what is indicated by reference numeral 200 is a nickel element which is held in contact with the surface of the amorphous silicon film 203. In this way, a state shown in FIG. 4 is obtained.

It should be noted that the layer 200 containing nickel elements therein can be formed on the surface of the amorphous silicon film 203 by allowing an organic binder or the like to be contained in the solution. In this situation, it is necessary that attention is paid so that nickel elements are dispersed in the layer.

Then, using the device shown in FIG. 1, a plasma processing is conducted on the amorphous silicon film 203. In this example, helium is used as a gas. In the plasma processing, the glass substrate in the state shown in FIG. 4 is disposed at a portion, which is indicated by reference numeral 107, of the device shown in FIG. 1.

It should be noted that the position of the substrate is adjusted by manipulating an adjusting bar 108 in such a manner that the ECR condition is satisfied just at the position of the substrate. The plasma processing is conducted in a state where the substrate is heated at a temperature of 400° C. It should be noted that the heating is conducted by a heater installed within a substrate holder 106.

After the plasma processing has been conducted, a heat treatment at 550° C. for 5 hours is conducted in the nitrogen atmosphere, to thereby crystallize the amorphous silicon film 203. Then, the substrate is taken out from the device shown in FIG. 1, and an active layer of a thin-film transistor is formed by patterning. In this way, the active layer 204 of the thin-film transistor is formed. Thereafter, a thin-film transistor is completed in accordance with processes shown in FIG. 2C and subsequent figures.

Seventh Embodiment

A manufacturing process according to a seventh embodiment is shown in FIG. 3. This embodiment is characterized by conducting a plasma processing after the amorphous silicon film has been patterned in the process of manufacturing the thin-film transistor shown in FIG. 2. It should be noted that the manufacturing conditions and so on are identical to those described in the fifth embodiment the manufacturing process of which is shown in FIG. 2, so tar as there is no special notice.

Figure 3A:
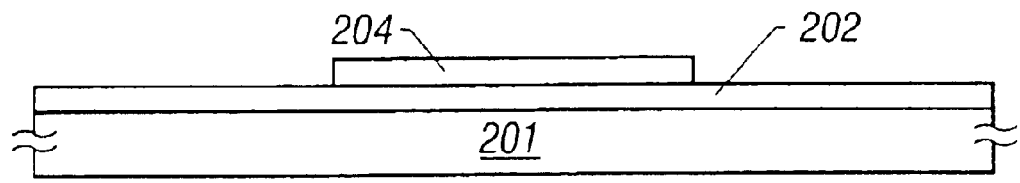
FIGS. 3A to 3D are diagrams showing a process of manufacturing a thin-film transistor.

First, as shown in FIG. 3A, a silicon oxide film 202 is formed on a glass substrate 210 as an under layer. Next, an amorphous silicon film (not shown) is formed on the silicon oxide film 202. Then, a region 204 which constitutes the active layer of the thin-film transistor is formed by patterning (FIG. 3A).

In this state, a processing using hydrogen plasma is conducted with the device shown in FIG. 1. As a result, the hydrogen plasma processing is conducted on not only the upper surface of the active layer but also the side surfaces of the active layer.

Thereafter, crystallization is conducted through a heat treatment. Also, as occasion demands, annealing is conducted by the irradiation of a laser beam or an intense light beam. In this state, the crystallization of the active layer at its side can be promoted.

It should be noted that a metal element that promotes the crystallization of silicon can be introduced before the heat treatment or the formation of an active layer. In this example, nickel is used as the metal element, and nickel elements are held in contact with the surface of the active layer and exposed side surfaces thereof.

Figure 3B:
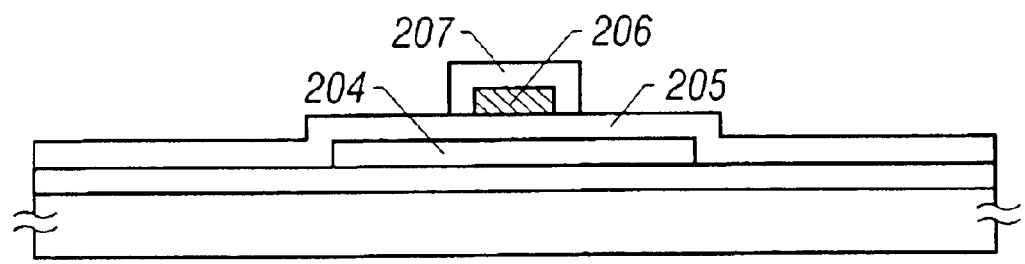
Figure 3C:
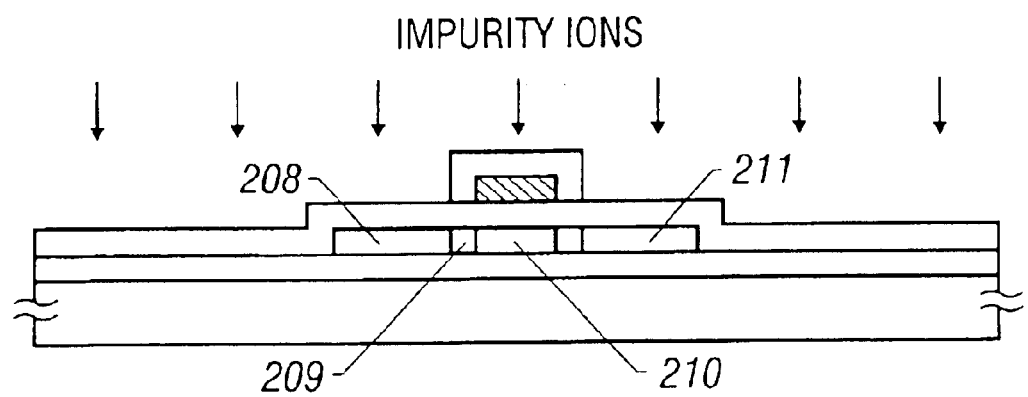
Figure 3D:
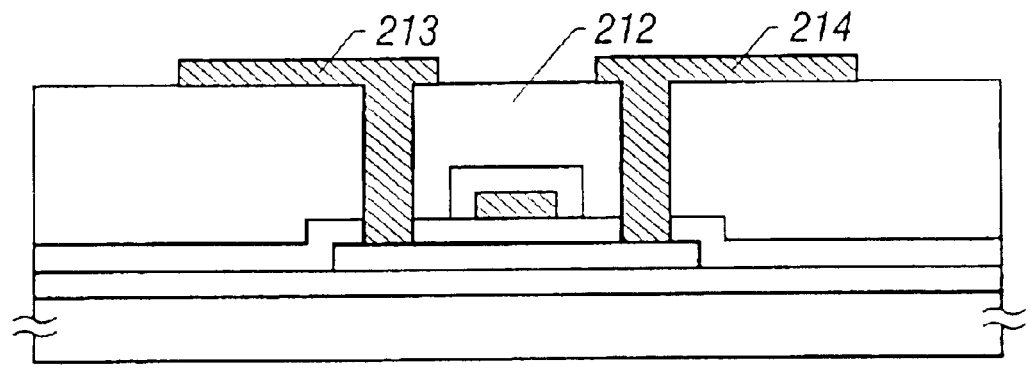

In the above manner, after a state shown in FIG. 3A is obtained, a thin-film transistor is completed in accordance with the same process as that shown in FIG. 2B which was described in the fourth embodiment. In other words, the process shown in FIG. 3B is identical to that shown in FIG. 2B. Also, a process shown in FIG. 3C is identical to that shown in FIG. 2C. Further, a process shown in FIG. 3D is identical to that shown in FIG. 2D.

When the structure shown in this embodiment is applied, an off-state current of the thin-film transistor can be reduced. The "off-state current" means that a current unavoidably flows between the source and the drain in an n-channel thin-film transistor when a minus potential is applied to the gate electrode (that is, in the-off-state operation). This current is caused by the movement of carries in accordance with an electric field which is applied between the source and the drain.

In the insulated gate thin-film transistor, while a minus potential is being applied to the gate electrode, a channel becomes p-type. Therefore, since npn is formed between the source and the drain, no current flows in principle. However, since the existence of a trap level causes the movement of carriers via the trap level, a fine current flows. In particular, a large number of defects caused when patterning exist on the side surfaces of the active layer, the trap level has a high density. Under this circumstance, according to this embodiment, a plasma processing is conducted after the active layer has been patterned so that a quasi-crystallization is made to progress with the result that an influence of the trap level on the side surfaces of the active layer can be restrained.

In this manner, the crystallization of the active layer on the side surfaces is improved, thereby being capable of reducing the trap level of the active layer on the side surfaces thereof. As a result, the movement of carriers via the trap level of the active layer on the side surfaces thereof can be restrained.

Eighth Embodiment

An eighth embodiment relates to a process of crystallizing an amorphous silicon film after a plasma processing has been conducted. In the present invention, as methods of crystallizing the amorphous silicon film after the plasma processing has been conducted, there are a heating method, a method of irradiating a laser beam while heating, a method of irradiating a laser beam after heating, a method of irradiating a laser beam after heating and further heating, and a method of repeatedly conducting heating and the irradiation of a laser beam in a plurality of times.

This embodiment is characterized in that a crystalline silicon film is obtained by conducting a heating after a plasma processing has been finished, the crystalline property of the silicon crystalline film is improved by conducting the irradiation of a laser beam while heating, and defects in the film are reduced by conducting a heat treatment.

The crystalline silicon film which has been obtained by conducting the heat treatment on the amorphous silicon film which has been processed by the exposure to hydrogen or helium plasma contains amorphous components at a rate of several to several tens % therein. This is recognized by observing a photograph taken by TEM (transmission electron microscope). The remaining amorphous components can be gradually reduced by further conducting a heat treatment. However, a heat treatment required in this case must be conducted for a long period of time, that is, 10 hours or longer. This is not preferable from the economical viewpoint. The heat treatment can be conducted at a temperature of about 550° C., but even at a temperature of 550° C., the long-period heat treatment is not preferable since it causes the deformation of the glass substrate.

It has been found through experiment that the remaining amorphous components can be crystallized by the irradiation of a laser beam onto the crystalline silicon film in which the above amorphous components remain. In other words, the crystalline property of the crystalline silicon film can be further improved by conducting the irradiation of a laser beam after the heat treatment has been conducted.

It should be noted that it is important to heat a sample at a temperature of from 300° C. to a strain point of the substrate in the irradiation of a laser beam. In the case where the substrate is not heated, the formation of a grain boundary in accordance with a rapid change in phase becomes remarkable so that an excellent crystal property cannot be obtained.

However, in the case where annealing is conducted by the irradiation of a laser beam, there arises such a problem that defects occur in accordance with the rapid change in phase even when using the above-mentioned method conducting the heat treatment together. For example, when a spin density after the irradiation of a laser beam is measured, it is recognized that its value is clearly increased. The spin density is an index representative of the number of unpaired binding band and can be understood to be representative of the number of defects in the film.

As described above, in the case where a laser beam is irradiated on the silicon film which has been crystallized by the heat treatment, the remaining amorphous components are crystallized, and the crystalline property of the film can be further enhanced. However, although the crystalline property of the film can be enhanced, the defects in the film are increased. This phenomenon can be understood that, with the irradiation of a laser beam, the remaining amorphous components are crystallized, and the crystallized components can be increased whereas defects occur with a very small level in accordance with a rapid change in phase due to the irradiation of a laser beam.

However, present inventors has found through experiment that the defects in the film can be reduced by further conducting a heat treatment in this state. A sufficient effect is obtained by conducting the heat treatment at a temperature as high as possible, to an extent of a strain point of a substrate to be used or lower, for one hour. For example, the sufficient effect can be obtained by conducting the heat treatment at a temperature of 550° C. for one hour.

Ninth Embodiment

A ninth embodiment shows an example in which a monocrystal-like region or a substantially monocrystal-like region is formed on a glass substrate. First, a silicon oxide film 302 is formed on a glass substrate 301 as an under layer. The silicon oxide film 302 may be formed through the sputtering technique or the plasma CVD technique. The thickness of the silicon oxide film 302 is set to 3000 Å.

Figure 5A:
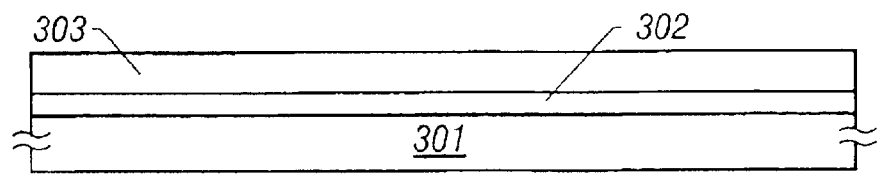
FIGS. 5A to 5E are diagrams showing a monocrystal-like region or a substantially monocrystal-like region.

Then, an amorphous silicon film 303 is formed on the under layer through the plasma CVD technique or the decompression thermal CVD technique. The amorphous silicon film 303 may have a required thickness. In this example, the thickness is set to 2000 Å (FIG. 5A).

Subsequently, using the plasma processing device shown in FIG. 1, a plasma processing is conducted on the amorphous silicon film 303 so as to conduct dehydrogenation from the interior of the film.

A hydrogen gas is supplied to the device shown in FIG. 1 from a gas supply system 101 to generate ECR plasma of hydrogen gas. Then, a hydrogen plasma is conducted on the amorphous silicon film 303. Also, during the plasma processing, the substrate is held at a temperature of 500° C. This is to promote the dehydrogenation from the interior of the film. The heating of the substrate is conducted by a heater installed within a substrate holder 206. The temperature range can be selected in a range of from 400° C. to a strain point of the substrate. For the heating method, means such as lamp heating may be used.

An adjustment bar 208 is adjusted so that the substrate is positioned in a region where the ECR conditions are satisfied or in the vicinity of that region. In other words, the substrate 207 is disposed in a region where the intensity of a magnetic field is 875 gauss or in the vicinity of that region. The "vicinity" in this specification is defined as a range within ±10% of the ECR conditions, more specifically, as a region within ±10% of the ECR conditions with a center of the intensity of a magnetic field where the ECR conditions are satisfied.

When the plasma processing is conducted under the ECR conditions using the device shown in FIG. 1, such an effect that the amorphous silicon film is heated through microwaves can be obtained. This is because the microwaves of 2.45 GHz are absorbed by Si—H binding. In particular, since the microwaves are absorbed by the surface of the silicon film, only the silicon film can be selectively heated. On the other hand, microwaves are hardly absorbed by the glass substrate. It should be noted that when the power of microwaves is too strong, event the glass substrate is heated at a high temperature by the heat conduction from the silicon film, to which attention must be paid.

This embodiment shows an example in which hydrogen plasma is used. Instead, helium gas plasma may be used. Also, plasma of mixed gas consisting of hydrogen and helium may be used.

Through the plasma processing, the amorphous silicon film is changed from the amorphous state to more systematic state. This is a state where crystallization is liable to more progress with the progress of hydrogenation. In this state, a crystalline silicon film is obtained by conducting a heat treatment at 550° C. for 5 hours. This heat treatment is conducted at a temperature of 550 to 600° C. for 5 to 10 hours. An upper limit of the heat treatment is defined by the strain point of a substrate as used.

It should be noted that metal elements that promote the crystallization of the silicon film may be added to the amorphous silicon film after the plasma processing is conducted. For example, a nickel acetate solution which is adjusted to a predetermined density is coated on the silicon film which has been subjected to the plasma processing through the spin coating technique, The density of nickel elements is adjusted so that the density of nickel in a semiconductor region which has been finally obtained (indicated by reference numerals 307 and 308 in FIG. 5E) is set to $1\times10^{14}$ to $3\times10^{18}$ cm$^{-3}$, a mean value of $1\times10^{15}$ to $3\times10^{19}$ cm$^{-3}$.

In this state, a crystalline silicon film is obtained by conducting a heat treatment at 550° C. for 5 hours.

After the crystalline silicon film has been obtained by the heat treatment, a portion which will constitute a seed of crystal growth later is formed on an arbitrary location. This portion has a size of 1 to 20 μm square. With this degree of size, that portion can be formed into a monocrystal-like region or a substantially monocrystal-like region. In other words, that portion can be changed into a region where no grain boundary substantially exists in the interior thereof, or come to a state where there arises no problem even though a grain boundary exists.

In this example, an island-like region indicated by reference numeral 304 in FIG. 5 is formed by patterning. In this case, what is indicated by reference numeral 304 is a region which is changed into a seed crystal. That region can be constituted as a monocrystal-like region or a substantially monocrystal-like region. In this way, a state shown in FIG. 5B is obtained.

After the formation of the seed, the surface of the exposed seed need to be cleaned (etched) by hydrofluoric acid etchant (need to contain hydrofluoric acid and hydrogen), for example, a solution (called "FPM") into which buffer hydrofluoric acid or hydrofluoric acid, excessive water and water are mixed together. This is because an oxide film formed on the surface of the seed or a film containing carbon or nitrogen therein is removed by etching. Also, in the case where the surface of the silicon film is cleaned by buffer hydrofluoric acid or FPM, hydrogen is absorbed on its surface, and unpaired binding bond of silicon atoms on the surface can be neutralized. Hence, oxidation or the formation of the film of other compounds can be restrained.

This embodiment shows an example in which one seed crystal is formed, but a plurality of seed crystals are formed on the same substrate in fact. In general, in a method of crystallizing the amorphous silicon film, a monocrystal film cannot be formed over a large area. In other words, although a large-sized crystal grain can be formed one by one, the whole film that forms one crystal grain (that is, monocrystal) cannot be formed.

Similarly, in this embodiment, a number of large crystal grains are formed. Then, the seed crystal (indicated by reference numeral 304 in FIG. 5B) is formed using this crystal grain (its interior can be substantially regarded as monocrystal).

In this case, the crystal grains are identical in their crystal axis (crystal axis perpendicular to the film) to each other, but their rotating angles with the crystal axes as a center are different from each other. In other words, a number of regions having different rotating angles with the crystal axes as a center are formed with a boundary of the grain boundaries. The orientations of the crystal axes perpendicular to the film in those regions are identical to each other. It should be noted that if the rotating angles are identical to each other, no grain boundary can be formed, and those regions are contained in the same crystal grain. In other words, a larger crystal grain is formed (monocrystal exists as its limit).

Figure 5B:
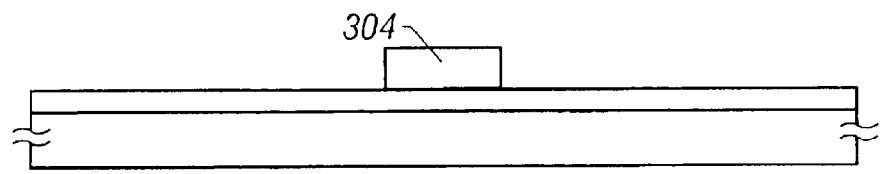
Figure 5C:
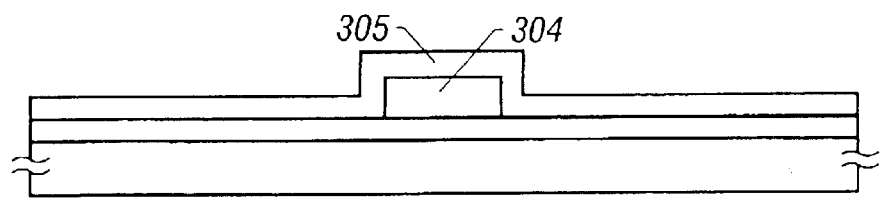

Subsequently, an amorphous silicon film 305 is formed through the plasma CVD technique or the decompression thermal CVD technique. In this example, the thickness of the amorphus silicon film 305 is set to 500 Å. In this way, a state shown in FIG. 5C is obtained. In this state, a plasma processing is further conducted. The plasma processing may be the same as that in the formation of the seed crystal. Then, a heat treatment is again conducted. With conducting of this heat treatment, the amorphous silicon film is crystallized. The heat treatment is conducted at a temperature of 550° C. for 6 hours.

Figure 5D:
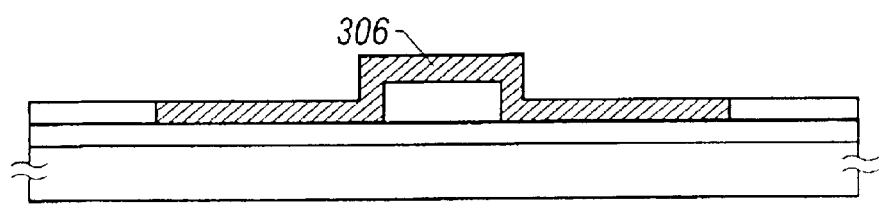

Through this heat treatment, the portion 304 is changed into a crystal nucleus, and crystal growth progresses. Through this heat treatment, the region 306 is crystallized. In this region, crystal growth is conducted with a nucleus of the monocrystal-like region or the substantially monocrystal-like region 304, and the monocrystal-like region or the substantially monocrystal-like region 306 is formed This region is obtained by conducting substantially circular crystal growth with a center of the seed portion 304, viewed from the upper (FIG. 5D).

The monocrystal-like region or substantially monocrystal-like region 306 is of a region having a single crystal structure such that the crystal axes are identical to each other in a direction perpendicular to the film, and the rotating angles with the crystal axes as a center are also identical to each other. The crystal axis is different depending on the film forming condition of the amorphous silicon film 303 which is a starting film. However, if the starting film which is uniformly formed on the same substrate is used, the substantially same crystal axis can be obtained.

Also, in the above-mentioned crystallizing process, the crystal growth can progress from the crystal seed by etching the surface of the seed of crystal growth with hydrofluoric acid etchant in advance. In the case where etching is not conducted on the surface of the crystal seed, the reproducibility of crystal growth cannot be obtained because of an oxide film or other compound films.

Figure 5E:
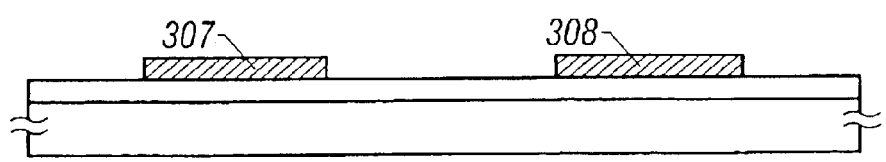

Then, the monocrystal-like region or substantially monocrystal-like region is subjected to a patterning, to thereby form island-like regions indicated by reference numerals 307 and 308. In this example, two island-like regions are formed as shown in FIG. 5E. However, a patterning as required can be conducted in a permissible range.

As shown in FIG. 5E, two (or a plurality of) island-like semiconductor regions which have been formed as one pair have a single crystal structure such that the crystal axes in a direction perpendicular to the film are identical to each other, and the rotating angles with the crystal axes as a center are also identical to each other.

With the use of these two regions, for example, the active layer of the thin-film transistor can be formed. Then, the thin-film transistor constituted by using those regions can obtain the same characteristic as that of a transistor which is constituted by using a monocrystal wafer.

In FIG. 5E, there is shown an example in which the monocrystal-like or substantially monocrystal-like region is formed from one crystal seed and then patterned, to thereby form two island-like semiconductor regions 307 and 308. However, in the actual process, it is normal that a large number of monocrystal-like or substantially monocrystal-like regions are formed by a large number of crystal seeds.

Figure 9:
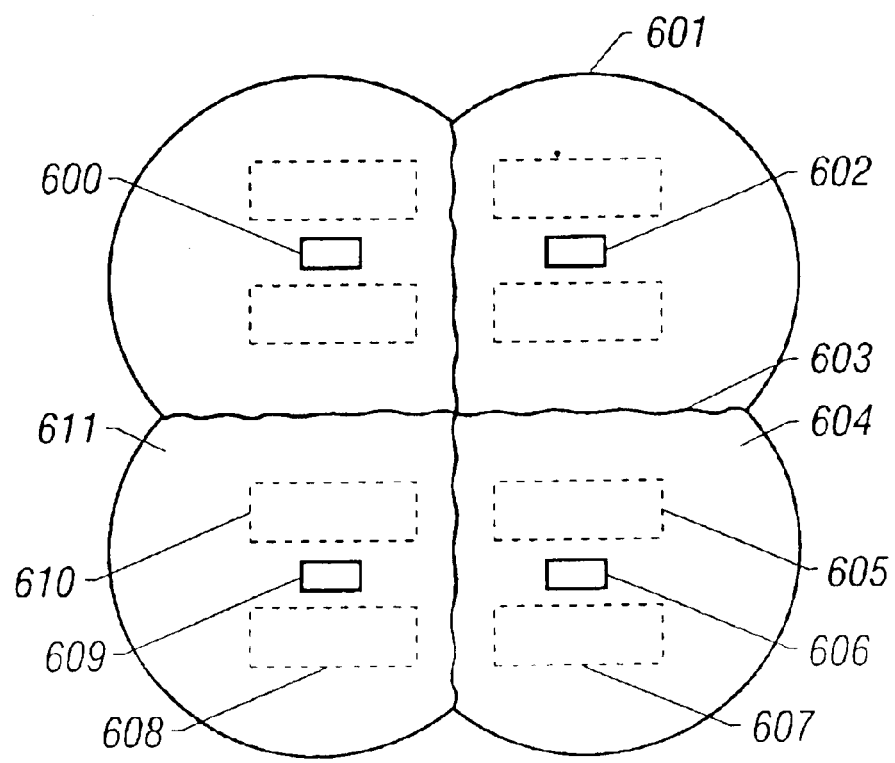
FIG. 9 is a diagram showing four monocrystal-like regions or substantially monocrystal-like regions.

FIG. 9 shows such an example. What is shown in FIG. 9 is an example in which four monocrystal-like regions or substantially monocrystal-like regions are formed by crystal growth of seeds 600, 602, 606 and 609. In FIG. 9, what are indicated by reference numerals 604 and 611 are one monocrystal-like region or substantially monocrystal-like region.

What are indicated by reference numerals 605 and 607 are semiconductor regions which are obtained by patterning the monocrystal-like region or substantially monocrystal-like region.

The semiconductor regions 605 and 607 in FIG. 9 correspond to a pair of semiconductor regions 307 and 308 in FIG. 5. The semiconductor regions 605 and 607 form one group, and their crystal axes and the rotating angles with the crystal axes as a center are identical.

The fact that the crystal axis of the semiconductor region 508 is identical to that of the semiconductor region 504 naturally results from that the crystal seed formed using the same starting film is used, and the same silicon film for crystal growth is used.

However, the rotating angle of the crystal axis of the semiconductor region 508 and the rotating angle of the crystal axis of the semiconductor region 504 are not generally identical to each other. This is because the monocrystal-like region or substantially monocrystal-like regions that form a base of the respective semiconductor regions are crystal grains which have grown from different crystal seeds.

Tenth Embodiment

Figure 6A:
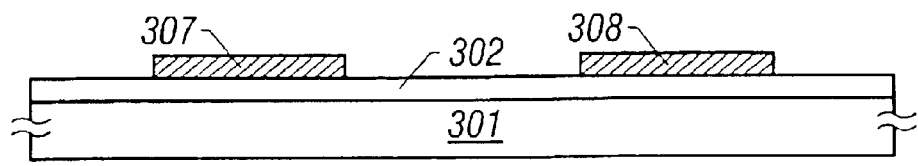
FIGS. 6A to 6D are diagrams showing a process of manufacturing a thin-film transistor.

A tenth embodiment shows an example in which a circuit with the CMOS structure is manufactured with the use of the paired two island-like semiconductor regions shown in the ninth embodiment. First, a state shown in FIG. 6A is obtained through the method shown in the ninth embodiment. This state is identical to that shown in FIG. 5E.

In this state, reference numeral 307 denotes an active layer of an n-channel thin-film transistor, and 308 is an active layer of a p-channel thin-film transistor.

Subsequently, a silicon oxide film that functions as a gate insulating film is formed. The silicon oxide film is formed through the plasma CVD technique or the sputtering technique. In this example, its thickness is set to 1000 Å. Furthermore, a film that mainly contains aluminum for constituting the gate electrode is formed through the electron beam vapor deposition technique or the sputtering technique. The thickness of that film is set to 5000 Å. Next, gate electrodes 310 and 311 are formed by patterning.

Figure 6B:
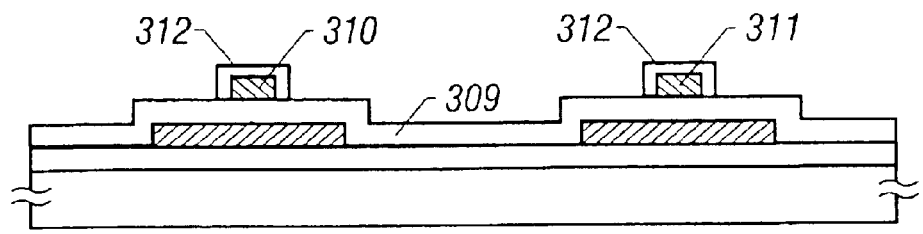

After the formation of the gate electrodes, anodic oxidation is conducted with the gate electrodes 310 and 311 as an anode in the electrolyte, to thereby form an anodic oxide film 312. The anodic oxide film is to restrain the pierced product caused by the abnormal growth of aluminum in a poststage. Then, that anodic oxide film is formed in order to restrain the occurrence of crosstalk or short-circuiting between upper and lower electrodes, adjacent electrodes, or wirings. The thickness of the anodic oxide film 312 may be selected in the range of about 100 to 800 Å. In the above-mentioned manner, a state shown in FIG. 6B is obtained.

Figure 6C:
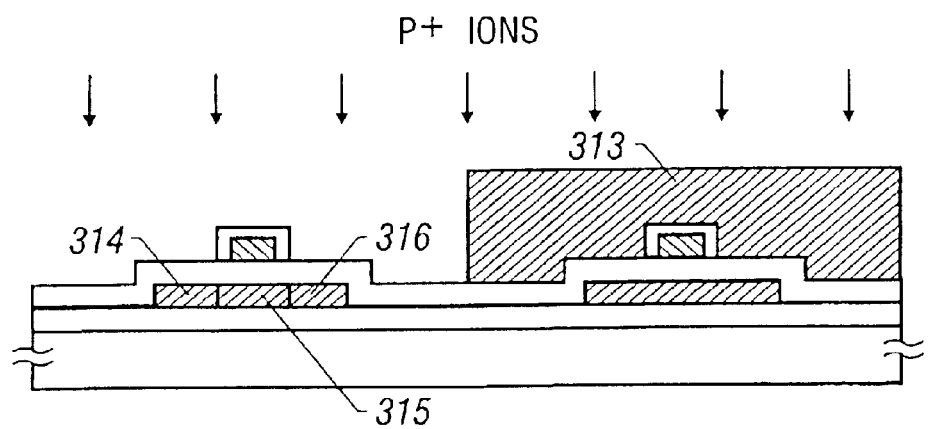

Thereafter, the region of one thin-film transistor is covered with a resist mask 313. In FIG. 6C, there is shown a state in which the region of the p-channel thin-film transistor is covered with the resist mask 313. In this state, P (phosphorus) ions are implanted into the surface through the plasma doping technique or the ion implantation technique. In this situation, P ions are not implanted in the region which is covered with the resist mask 313. As a result, P ions are implanted into regions 314 and 316. Also, P ions are not implanted in a region 315 with the gate electrode 310 that functions as a mask.

In the above way, the source region 314 and the drain region 316 are formed in the self-alignment manner. Also, the channel formation region 315 is formed (FIG. 6C).

Subsequently, the resist mask 313 is removed from the surface, and the thin-film transistor into which P ions have been implanted in the previous process is covered with a resist mask (not shown). Then, in the process shown in FIG. 6C, B (boron) ions are implanted on the region which had been in covered with the resist mask 313 (this process is not shown).

Figure 6D:
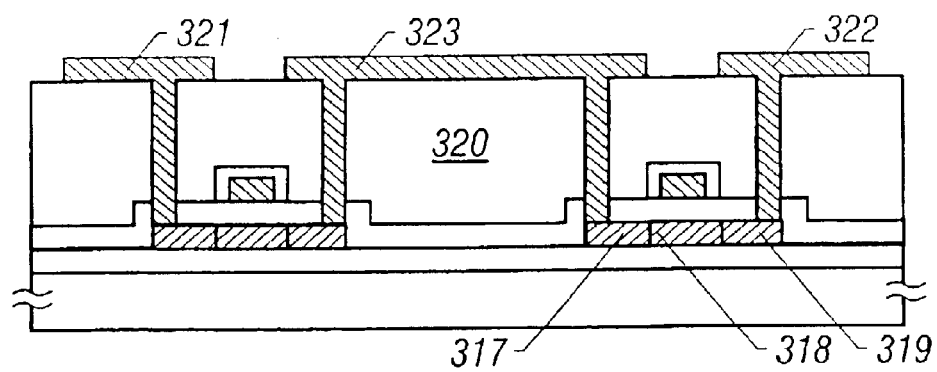

In this way, the source and drain regions of the right-sided p-channel thin-film transistor are formed. In other words, as shown in FIG. 6D, a source region 319, a drain region 317 and a channel formation region 318 of the p-channel thin-film transistor are formed in the above-mentioned manner.

After the implantation of P and B impurity ions has been finished, the activation of the implanted impurity ions and the annealing of damages of the surface due to the impulse of ions are conducted by the irradiation of a laser beam.

Subsequently, a silicon oxide layer 320 is formed as an interlayer insulating film through the plasma CVD technique. The silicon oxide film as formed may have a thickness of 6000 Å. Thereafter, contact holes are formed, and electrodes 321 and 322 which are in contact with the source region and an electrode 323 which is common to the drain regions of both the thin-film transistors are formed by a laminate film comprised of a titanium film and an aluminum film.

In this way, a circuit element of the CMOS structure in which the left-sided n-channel thin-film transistor and the right-sided p-channel thin-film transistor are complementary to each other. In FIG. 6D, an input electrode of the CMOS circuit is an electrode (not shown) which is commonly connected to gate electrodes 310 and 311, and an output electrode thereof is an electrode 123.

The CMOS circuit shown in this embodiment is constituted by a monocrystal-like regions or substantially monocrystal-like regions 307 and 308 in FIG. 6A in which the directions of the same crystal axes are substantially identical to each other, and angles with the crystal axes as a center are substantially identical to each other.

Also, this embodiment shows an example in which the entire active layers 307 and 308 forming a thin film transistor in FIG. 6A are constituted by a monocrystal-like region or substantially monocrystal-like region.

However, if the lowered characteristic of the thin-film transistor is permitted, the channel formation region of the thin-film transistor may be comprised of at least a monocrystal-like region or substantially monocrystal region. In other words, grain boundaries may exist in parts of the source or drain region.

Also, this embodiment shows an example in which a thin-film transistor circuit having a pair of CMOS structures is constituted by one crystal seed. However, a large number of like circuits are actually disposed in other regions.

In this case, the respective circuits are comprised of monocrystal-like regions or substantially monocrystal-like regions which have been formed on the basis of different crystal seeds, respectively. Since the respective crystal seeds are generally formed from different crystal grains (it is needless to say that there is a case in which they are formed from the same crystal grains), it is found that the crystal seeds have different crystal axes (there is a case where they happen to have identical crystal axes).

Accordingly, assuming that a thin-film transistor circuit having a pair of CMOS structures is one group, although the crystal axes of the active layers (semiconductor regions) are identical (substantially identical) to each other within the groups, the rotating angles with the crystal axes as a center are different from each other.

Eleventh Embodiment

An eleventh embodiment relates to one structure of a substrate that forms an active matrix liquid-crystal display unit. Speaking in more detail, this embodiment shows an example of manufacturing one of a pair of glass substrates that constitute a liquid-crystal panel (liquid crystal is held between the paired glass substrates).

FIG. 7 shows a process of manufacturing an active matrix liquid-crystal display unit. First, a silicon oxide film 402 that functions as an under layer and has a thickness of 3000 Å is formed on a glass substrate 401 through the sputtering technique or the plasma CVD technique. Then, an amorphous silicon film having a thickness of 3000 Å is formed on the silicon oxide film 402 through the plasma CVD technique or the decompression thermal CVD technique.

Subsequently, using the device shown in FIG. 1, a plasma processing due to hydrogen plasma or helium plasma is conducted. In other words, a substrate is disposed on a substrate holder 106 of the device shown in FIG. 1, and a hydrogen plasma processing is conducted on the amorphous silicon film.

Figure 7A:
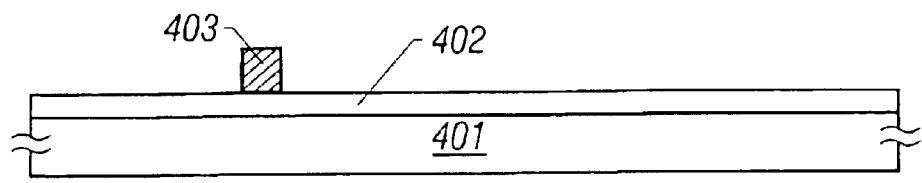
FIGS. 7A to 7D are diagrams showing a process of manufacturing a thin-film transistor.

Further, a heat treatment at 550° C. for 6 hours is conducted in the nitrogen atmosphere, to thereby crystallize the silicon film which has been subjected to the plasma processing. Then, a portion 403 that will come into a seed (which is also called "crystal growth nucleus") of crystal growth later is formed by patterning the silicon film. In this way, a state shown in FIG. 7A is obtained.

In this example, after the plasma processing for dehydrogenation has been conducted, crystallization is conducted and patterning for forming a crystal seed is conducted. However, as another example, there may be applied a method in which patterning is conducted after the plasma processing has been conducted, and then heating is conducted for crystallization.

It should be noted that a metal element that promotes the crystallization of silicon may be added to the amorphous silicon film before the crystallizing process due to heating. For example, a nickel acetate solution is coated on the silicon film through the spin coating technique so that nickel elements are held in contact with the silicon film. It should be noted that this process may be conducted before the plasma processing. However, in this case, attention must be paid to a fact that nickel elements are scattered during the plasma processing.

Also, there may be applied a method in which a plasma processing is conducted after patterning, and heating is then conducted for crystallization. When this method is applied, since the plasma processing and the crystallization processing are conducted after a region which is capable of coming into a fine seed crystal has been formed, a seed crystal can be more readily formed. In this case, nickel elements are added to the silicon film before patterning the silicon film.

Figure 7B:
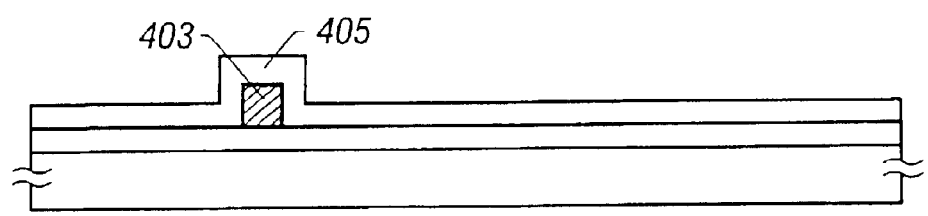

After a state shown in FIG. 7A has been obtained, the amorphous silicon film 405 is formed on the entire surface of the silicon oxide film 402 in such a manner that it covers a seed 403 of crystal growth. The amorphous silicon film is used to form the active layer of a thin-film transistor later. The formation of this amorphous silicon film may be made through the plasma CVD technique or the decompression thermal CVD technique. Also, the thickness of the amorphous silicon film is set to 500 Å. In this manner, a state shown in FIG. 7B is obtained.

Then, a dehydrogenation processing due to hydrogen plasma is conducted using the device shown in FIG. 1. Furthermore, a heat treatment at a temperature of 550° C. for 6 hours is conducted to make crystal growth progress from the crystal seed 403 of the amorphous silicon film 405 so that a monocrystal-like region or substantially monocrystal-like region can be formed in the periphery of that crystal growth.

Subsequently, a patterning is conducted to form regions 406, 407 and 408 that will come into the active layers of the thin-film transistor. The regions 406 and 407 that will come into the active layers constitute a p-channel thin-film transistor and an n-channel thin-film transistor which are disposed in a peripheral drive circuit region. Also, a region 408 constitutes an n-channel thin-film transistor disposed in a pixel region.

The active layers 406 and 407 are comprised of monocrystal-like regions or substantially monocrystal-like regions. With such a structure, the peripheral drive circuit can be comprised of a thin-film transistor which consists of the monocrystal-like region or substantially monocrystal-like region. Also, in the active layers 406 and 407, the crystal axes in a direction perpendicular to those surfaces have the substantially identical direction, and the rotating angles about their crystal axes are also substantially identical to each other. This is because they are formed within a single crystal grain (monodomain) that has grown from the same crystal seed 403.

Then, a silicon oxide film 409 that functions as a gate insulating film and has a thickness of 1000 Å is formed on the surface through the plasma CVD technique. Thereafter, a film that mainly contains aluminum for constituting a gate electrode and has a thickness of 5000 Å is formed on the silicon oxide film 409 through the sputtering technique or the electron beam vapor deposition technique. Then, gate electrodes 410, 411 and 412 is formed by patterning the film.

Furthermore, anodic oxidation is conducted with the respective gate electrodes as an anode in the electrolyte, to thereby form anodic oxide layers 413, 414 and 415. The anodic oxide layers are thinned to the thickness of about 500 to 1000 Å. This is made for preventing short-circuiting between the adjacent electrodes or short-circuiting between the upper and lower, which is caused by the abnormal growth of aluminum, and such a thin anodic oxide layer does not lead to any problem.

The thickness of the anodic oxide film 415 is set to about 2000 Å. This is because the anodic oxide film 415 is made to function as a mask to form an offset gate region in a process of implanting impurity ions which will be made later, in addition of the above-mentioned reason.

Figure 7C:
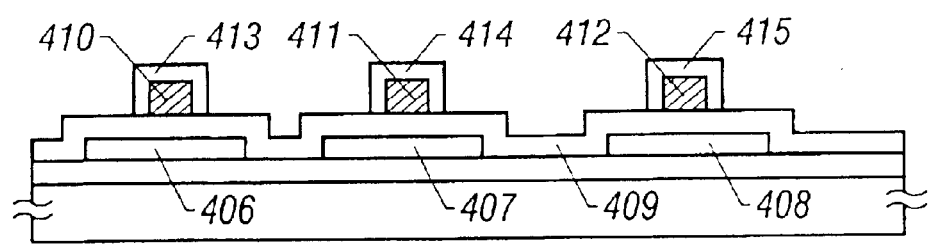

In this way, a state shown in FIG. 7C is obtained. In this state, the implantation of impurity ions is conducted to form source and drain regions. In this example, a resist mask (not shown) is first formed so as to cover the upper regions of the active layers 407 and 408. Then, B (boron) ions which are impurities for giving the p-type are accelerated and implanted into the surface through the ion implantation technique or the plasma doping technique. Through this process, the gate electrode 410 serves as a mask, and B ions are implanted in the regions that will come into the source and drain regions of the active layer 406 in a self-alignment manner.

Thereafter, the resist mask that covers the active layers 407 and 408 is removed from the surface to form a resist mask (not shown) that covers the active layer 406. Then, P (phosphorus) ions are implanted into the surface. In this way, the source and drain regions are formed in the active layers 407 and 408. In this situation, an offset gate region is formed between the channel formation region and the source/drain region in the active layer 408. This is because anodic oxide films on the side surfaces of the gate electrode 412 serve as a mask when implanting impurity ions.

After the implantation of impurity ions has been finished, the irradiation of a laser beam or an intense light beam is conducted to perform the annealing of damages of the surface caused by the implantation of ions and the activation of the implanted ions.

Subsequently, a silicon oxide film 416 having a thickness of 7000 Å is formed as an interlayer insulating film through the plasma CVD technique. Then, an ITO electrode 417 forming a pixel electrode is formed on the film.

After contact holes have been formed, a film which is a three-layer film consisting of a titanium film, an aluminum film and a titanium film is formed on the surface, and source electrodes 418 and 420 and a drain electrode 419 which is common to two TFTs are formed by patterning that film.

In this way, there is formed a CMOS circuit in which the p-channel type and the n-channel type are complementary to each other with a PTFT (p-channel thin-film transistor) and an NTFT (n-channel thin-film transistor). Simultaneously, a source electrode 421 and a drain electrode 422 of the rightmost-sided NTFT are formed. The drain electrode 422 and the pixel electrode 417 of the pixel thin-film transistor is connected to each other. It should be noted that the rightmost-sided NTFT is arranged in each of a large number of pixel electrodes disposed in the form of a matrix although only one rightmost-side NTFT is shown.

Figure 7D:
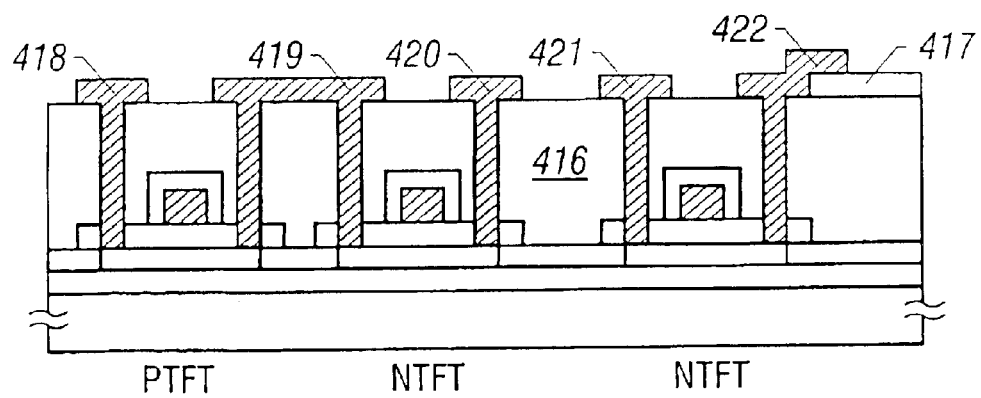
Figure 8:
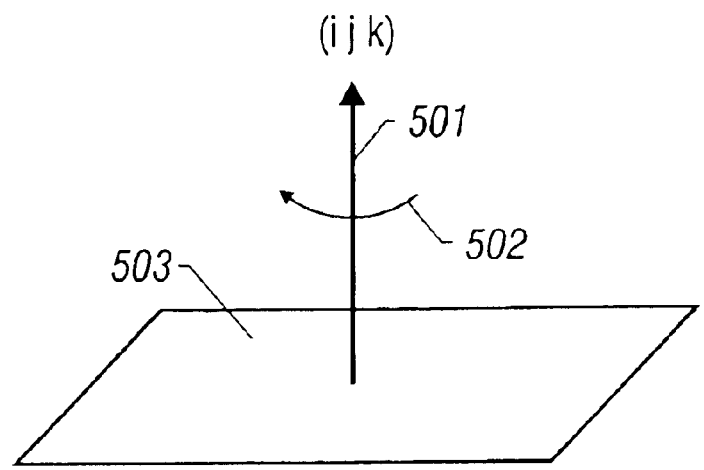
FIG. 8 is a diagram for defining a crystal axis and a rotating angle with the crystal axis as a center.

In this way, a state shown in FIG. 7D is obtained. For constituting a liquid-crystal panel, an interlayer insulating film is further formed of a silicon oxide film or the like, and an oriented film made of a resin material (for example, polyimide) for orienting liquid crystal is formed on the interlayer insulating film. Also, an opposing electrode and an oriented film are formed on a glass substrate that forms the other substrate. Then, those two glass substrates are bonded together through a spacer or a seal layer, and a gap therebetween is filled with liquid crystal. In this manner, an active matrix liquid-crystal display panel is formed.

In the structure shown in this embodiment, since a thin-film transistor that forms a CMOS circuit of the peripheral drive circuit is constituted by a monocrystal-like region or substantially monocrystal-like region, such a peripheral drive circuit as to deal with an image signal having a band of several tens MHz can be formed.

The active layer of the thin-film transistor disposed in the pixel region remains in the amorphous state, and the amorphous silicon thin film is used in the pixel thin-film transistor. However, since the pixel region does not require so high-speed operation, there arises particularly no problem when a normal image is displayed.

Twelfth Embodiment

A twelfth embodiment is characterized in that a portion that will form a seed of crystal growth is crystallized by the application of an energy after patterning has been conducted in a process of forming a seed for crystal growth in a process shown in FIG. 5.

This embodiment will be described hereinafter with reference to FIG. 5. The description of the processes or reference marks shown in FIG. 5 is identical to that in the ninth embodiment, so far as there is no special notice. First, as shown in FIG. 5A, an under film 302 is formed on a glass substrate 301, and an amorphous silicon film 303 is formed on that under film 302. Then, a seed 304 for the crystal growth of an amorphous state a region 204 is formed by patterning the amorphous silicon film 303. This seed may be set to 1 to 20 μm square (FIG. 5B).

In this state, a dehydrogenation process is conducted. In this example, a hydrogen plasma processing is conducted on the seed 304 for the crystal growth of an amorphous state, using the device shown in FIG. 1, so as to eliminate hydrogen from the interior of the seed 304.

It should be noted that metal elements are held in contact with a silicon film after a hydrogen plasma processing has been conducted. In this process, for example, in the case where nickel is used as the metal elements, nickel acetate may be coated on the silicon film through the spin coating technique.

Subsequently, a heat treatment, the irradiation of a laser beam or the irradiation of a laser beam while heating is conducted to crystallize the seed 304 for crystal growth. In this situation, since the seed 304 is a fine region, the seed 304 can be readily changed into a monocrystal-like region or substantially monocrystal-like region. The processes shown in FIG. 5C and the following drawing are identical to those shown in the ninth embodiment.

When applying the process shown in this embodiment, since a heat treatment is conducted after a region that will come into a seed crystal has been patterned, a seed crystal portion can surely come into the monocrystal-like region or substantially monocrystal-like region.

In other words, in the case where patterning is conducted after the crystallization described in the ninth embodiment has been conducted to form a seed crystal, it is impossible to remove the possibility that a grain boundary exists in the interior of the seed crystal. However, in the case where crystallization is conducted after a region that will come into a crystal seed has been formed by patterning, since the crystal seed is of a fine region, it can surely have a monocrystal-like structure or a substantially monocrystal-like structure.

Thirteenth Embodiment

A thirteenth embodiment is characterized in that a dehydrogenation process is conducted after an amorphous silicon film 303 has been formed, patterning is conducted, and crystallization is conducted by applying an energy in the process shown in FIG. 5, to thereby form a seed of crystal growth. The dehydrogenation process and other processes may be conducted in accordance with the same conditions and structures as those in the above-mentioned ninth to thirteenth embodiments.

Similarly, this embodiment can obtain the availability that seed crystal can surely have the monocrystal-like structure or substantially monocrystal-like structure.

Fourteenth Embodiment

The above-mentioned embodiments 9 to 13 mainly show examples in case of conducting heating as a method of giving an energy for crystallization. However, as a crystallizing manner which is more effective than the heating, there is an example of methods of conducting the irradiation of a laser beam while heating. For a laser beam, it is preferable to use a pulse oscillation laser having a wavelength of an ultraviolet region or less. For example, the KrF excimer laser or the XeCl excimer laser may be preferably used.

Also, in irradiating a laser beam, it is important to heat a sample (substrate) or a surface to be irradiated to a temperature of from 400° C. to a strain point of a glass substrate, or to a temperature of from 400° C. to the crystallization temperature of an amorphous silicon film. This temperature is preferably set as high as possible. The heating is very effective in restraining a rapid change in a phase in accordance with the irradiation of a laser beam and in preventing a grain boundary or defects from being produced.

It should be noted that although the crystallization temperature of the amorphous silicon film depends on the film forming method and the film thickness, it is about 600 to 650° C.

Fifteenth Embodiment

A fifteenth embodiment shows an example in which a thin-film transistor is formed using a monocrystal-like region or a substantially monocrystal-like region which has been obtained through the process shown in FIG. 5. More specifically speaking, this embodiment shows an example of patterning the monocrystal-like region or a substantially monocrystal-like region.

Figure 10A:
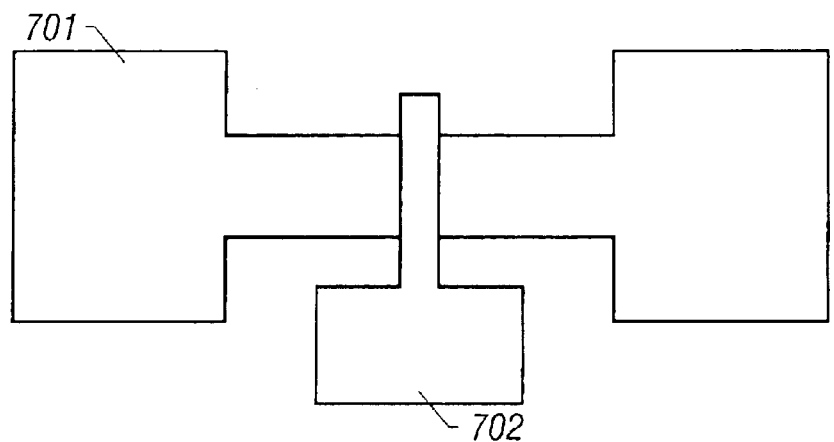
FIGS. 10A and 10B are diagrams showing a pattern of a semiconductor region constituting a thin-film transistor, respectively.

What is shown in FIG. 10A is an example of patterning in case of forming one thin-film transistor using a monocrystal-like region or a substantially monocrystal-like region. In the patterning shown in FIG. 10A, a monocrystal-like region or a substantially monocrystal-like region is patterned in a pattern 701, to thereby form the active layer of a thin-film transistor. In other words, in this case, the active layer of the thin-film transistor has the pattern 701.

Also, in FIG. 10A, reference numeral 702 denotes a gate electrode. The region of the active layer 701 that crosses the gate electrode comes into a channel formation region.

Figure 10B:
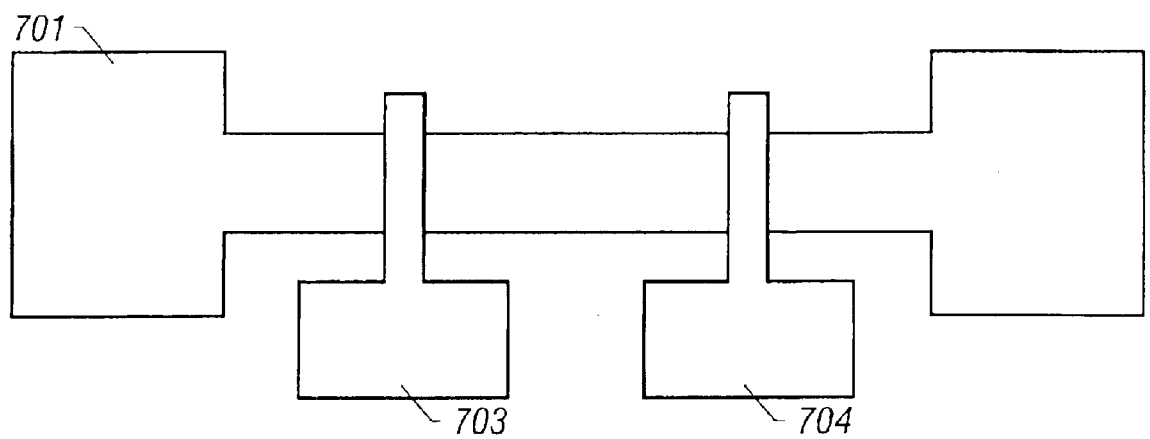

What is shown in FIG. 10B is an example in which two gate electrodes are disposed on the active layer 701. In such a case, different signals or potentials are given to these two gate electrodes so that the entire device can function as one element.

Sixteenth Embodiment

A sixteenth embodiment relates to the shape of patterning of a seed crystal. For example, the above-mentioned ninth embodiment shows an example in which a seed for crystal growth has a size of 1 to 20 μm square. However, the shape of the seed for crystal growth is not limited to a square. This embodiment shows an example in which a crystal seed is patterned in a rectangular form.

Figure 11A:
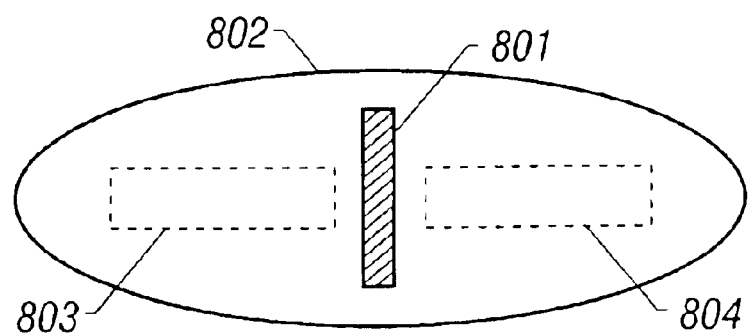
FIGS. 11A and 11B are diagrams showing a state of crystal growth from a region which forms a seed of crystal growth and a pattern of a semiconductor region obtained by patterning.

FIG. 11A shows a first example. The structure shown in FIG. 11A shows a state in which a crystal seed 801 is formed in a rectangular form, and crystal growth is made from that crystal seed 801. In FIG. 11A, reference numeral 802 denotes a monocrystal-like region or a substantially monocrystal-like region. Then, regions 803 and 804 are made to remain by patterning, thereby being capable of forming an island-like region which is formed of a monocrystal-like region or a substantially monocrystal-like region. Then, a thin-film transistor or other thin-film semiconductor devices having that region as an-active layer can be formed.

A pair of thin-film transistors can be constituted by positioning as shown in FIG. 11A. For example, a CMOS structure or an invertor circuit that consists of the combination of the p-channel type and the n-channel type can be constituted.

Figure 11B:
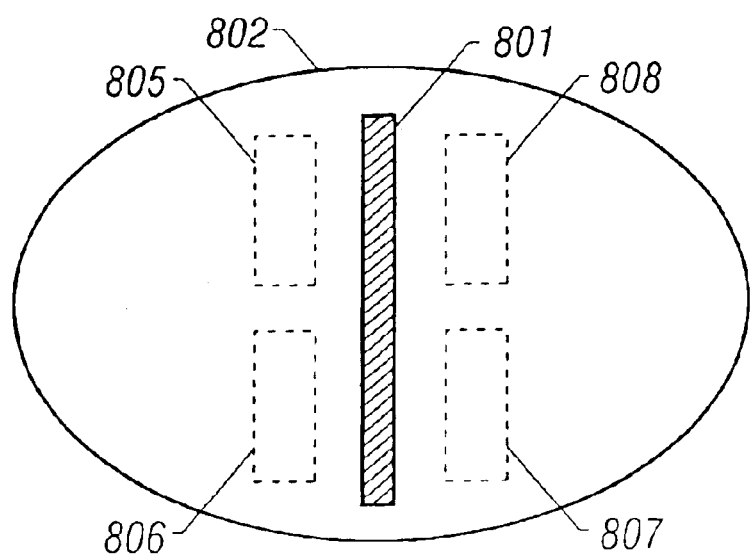

FIG. 11B shows a second example. In the example shown in FIG. 11B, a region 802 can be changed into a monocrystal-like region or a substantially monocrystal-like region by crystal growth from a rectangular crystal seed region 801. Then, regions 805 to 808 are made to remain by patterning, thereby being capable of forming a plurality of monocrystal-like regions or substantially monocrystal-like regions.

The thin-film integrated circuit consisting of a large number of thin-film transistors can be formed by a region having the same crystal axes and rotating angles therearound by positioning as shown in FIG. 11B.

Seventeenth Embodiment

Figure 12:
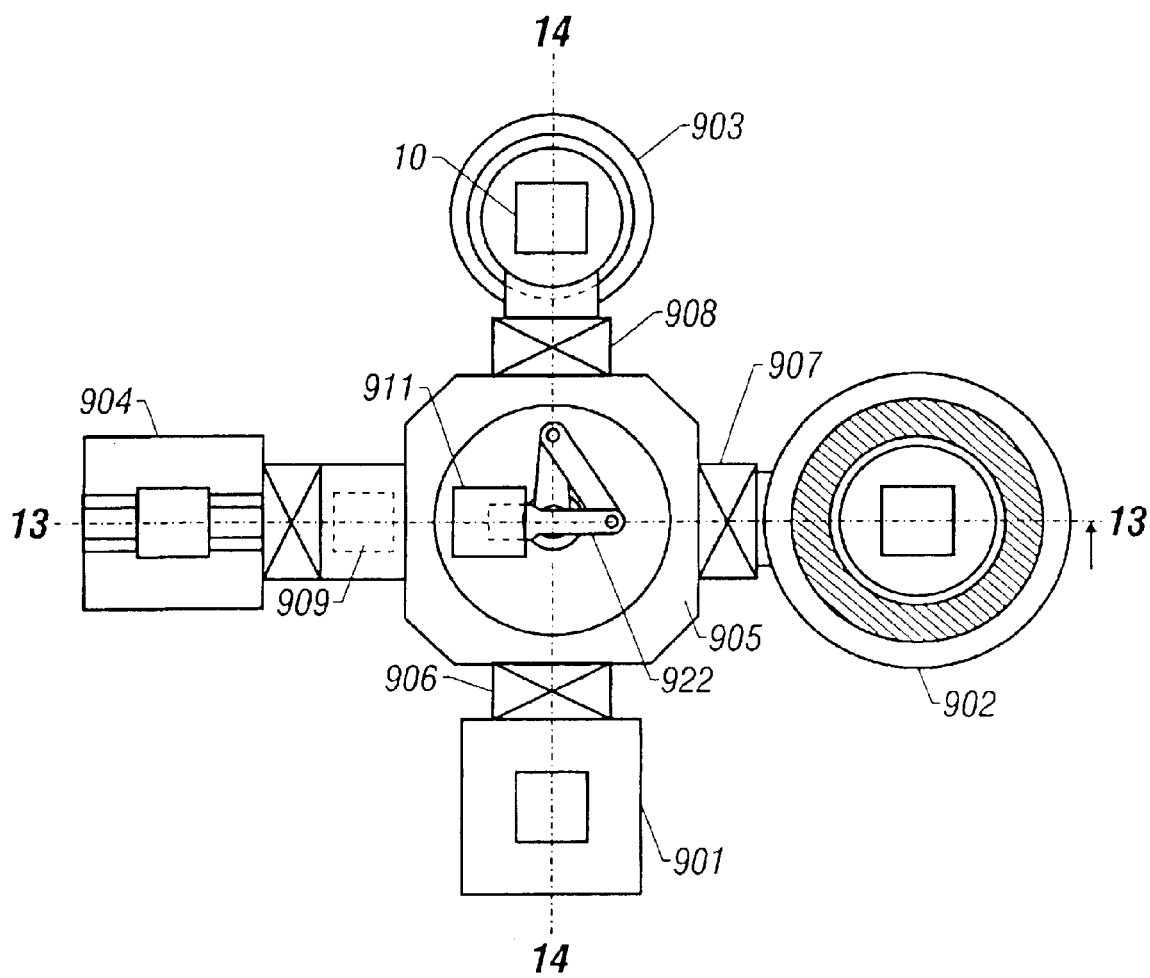
FIG. 12 is a schematic diagram showing an outline of a device for continuously conducting a plasma processing and the irradiation of a laser beam.

FIG. 12 shows a device in accordance with a seventeenth embodiment. The device shown in FIG. 12 has a structure in which a plasma processing chamber, a heating chamber and a laser beam irradiating chamber are disposed independently with a substrate transporting chamber as a center. Using the device shown in FIG. 12, the plasma processing, heating and the irradiation of a laser beam can be continuously conducted in the circumstances with no contamination.

The device shown in FIG. 12 includes a substrate take-in and take-out chamber 901 for taking a substrate in the device and taking out the substrate from the device, a plasma processing chamber 902 for conducting a plasma processing on the amorphous silicon film formed on the substrate, a heating chamber 903 for heating the silicon film formed on the J substrate, a laser irradiating chamber 904 for irradiating a laser beam onto the silicon film formed on the substrate, and a substrate transporting chamber 905 having means for transporting the substrate between the respective chambers.

Figure 13:
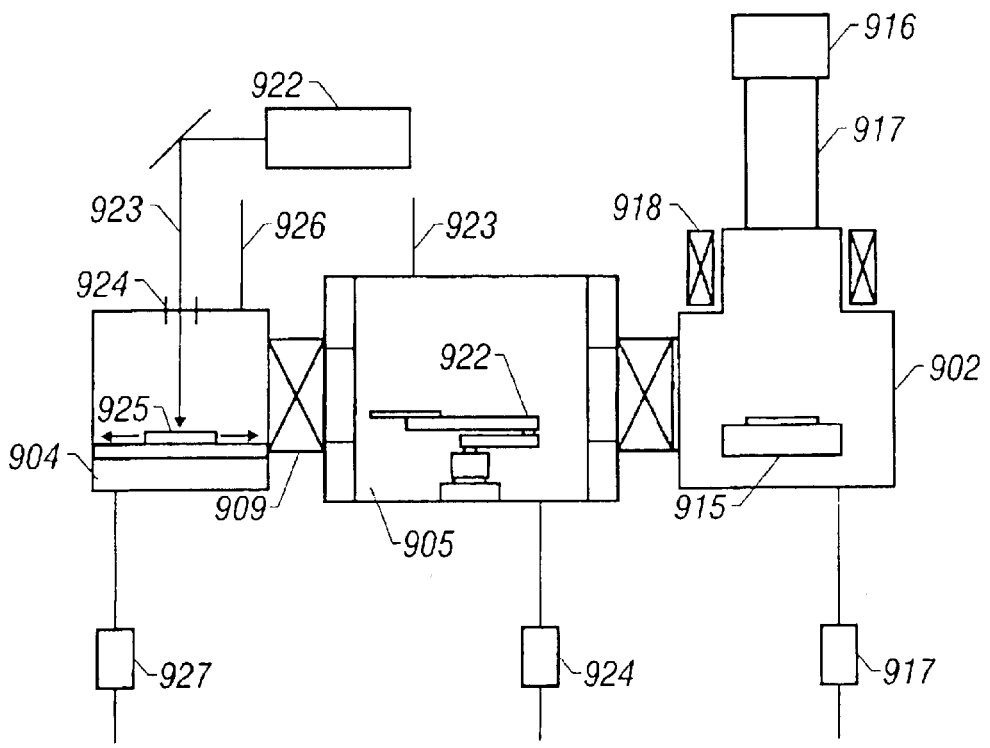
FIG. 13 is a schematic diagram showing an outline of a device for continuously conducting a plasma processing and the irradiation of a laser beam.
Figure 14:
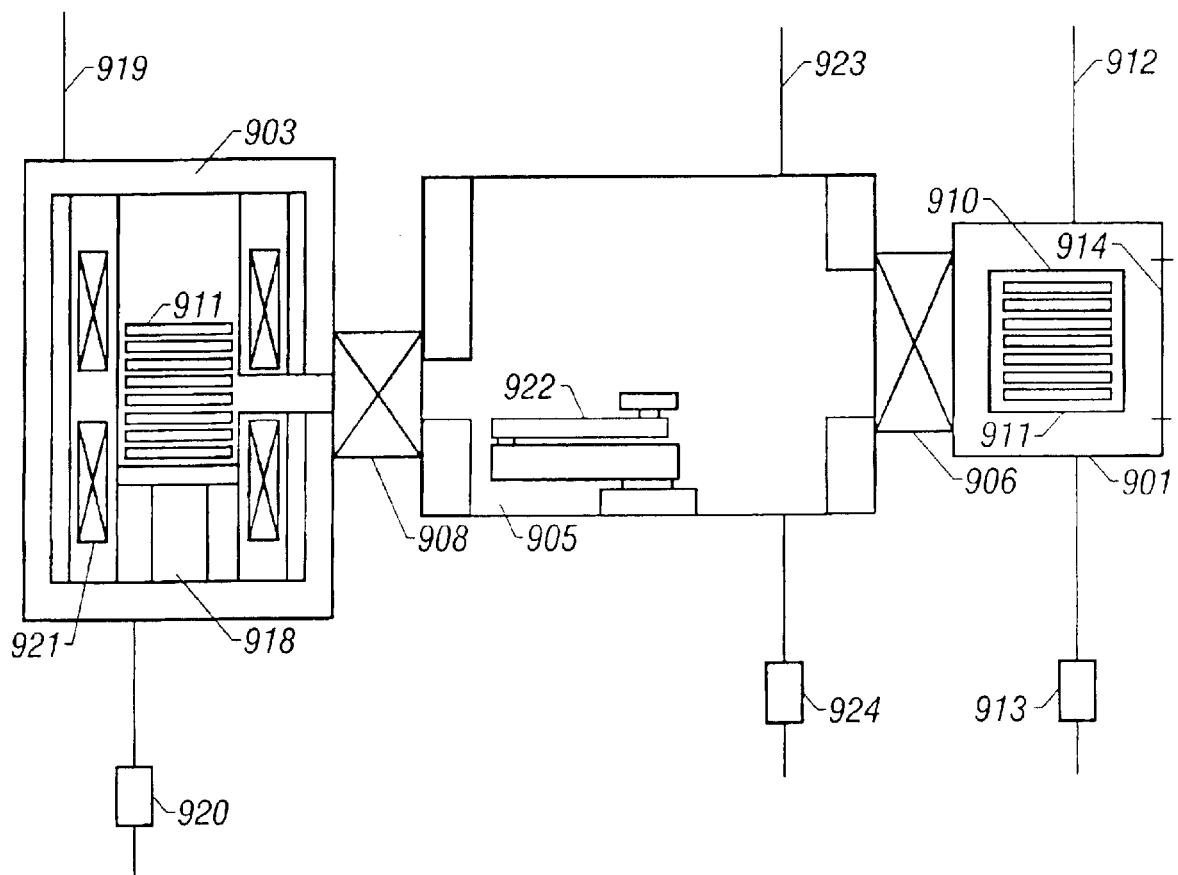
FIG. 14 is a schematic diagram showing an outline of a device for continuously conducting a plasma processing and the irradiation of a laser beam.

FIG. 13 shows a section taken along a line A–A' in FIG. 12. FIG. 14 shows a section taken along a line B–B' in FIG. 12. The respective chambers have a structure with an airtightness, and as occasions demand, they can come into a high vacuum state. Also, the respective chambers are connected to each other through the substrate transporting chamber 905 which is a common chamber and gate valves 906, 907, 908 and 909. The gate valves are structured so as to provide a sufficient airtightness.

Then, the respective chambers will be described in more detail. Reference numeral 901 denotes a substrate take-in and take-out chamber for conducting the take-in and take-out of the substrate with respect to the device. As shown in FIG. 14, each cassette 911 is taken in the chamber 901 from the external of the device through a door 914 in a state where a large number of substrates 911 are received in the cassette 910. Also, after the processing has been finished, the substrates in each cassette 910 are taken out to the exterior of the device from the door 914.

The door take-in and take-out chamber 901 is equipped with a gas introducing system 912 for purge such as an inactive gas and an exhaust pump 913 for exhausting an unnecessary gas and for making an in-room pressure in a reduced pressure state or in a high vacuum state.

Reference numeral 902 in FIGS. 12 and 13 denotes a plasma processing chamber. In this chamber, a plasma processing is conducted on the amorphous silicon film formed on the glass substrate by hydrogen plasma or helium plasma which is generated under the ECR condition.

The plasma processing chamber 902 is equipped with a coil 918 and a microwave oscillator 916 which generate a magnetic field, and a waveguide 917 for guiding microwaves in the processing chamber so as to realize the ECR condition for generating plasma.

The ECR is realized when $2\pi f = eB/m$ is satisfied where f is a frequency of microwaves, B is a magnetic flux density, m is an electron mass, and e is an electron charge. In the plasma processing chamber 902, the ECR condition is realized by setting the frequency f of microwaves, the magnetic flux density B of a magnetic field in the coil to values that satisfy the above-mentioned conditional expression.

In the structure shown in this embodiment, the position of a substrate stage 915 is adjusted so as to realize the ECR condition just at a position where the substrate is located. In other words, the substrate is disposed at a position where the magnetic flux density satisfies the above-mentioned ECR condition.

In a region where the ECR condition is satisfied, plasma is heated at a high temperature. Then, the substrate is also heated. This is to further promote the order of a crystal structure in the film.

Also, the plasma processing chamber 902 is provided with a gas introducing system 916 and a gas exhaust system having an exhaust pump 917. Hydrogen gas or helium gas is introduced from a gas introducing system 912, and a required decompression state can be realized by the air exhaust pump 917.

A chamber 903 shown in FIGS. 12 and 14 is a chamber (heating chamber) for heating a substrate on which a silicon film is formed. The substrates 911 are received on a stage 918 by which a large number of substrates 911 go up and down. The substrates received on the stage 918 is heated by a heating heater 921 in the heating chamber 903.

Similarly, the heating chamber 903 is equipped with an inactive gas introducing system 919 for purge and an air exhaust pump 920 which is capable of making a pressure within the heating chamber in a high vacuum state.

Reference numeral 904 denotes a chamber (a laser processing chamber) for irradiating a laser beam onto the silicon film formed on the substrate. A laser beam is oscillated by an oscillator 922 and allowed to pass through an optical system (not shown) so as to be formed into a required beam. In this example, the laser beam is formed into a linear beam having a width of several mm to several cm and a length of several tens cm.

The beam is then allowed to pass through a window 924 which is made of quartz by a mirror or the like, and the laser beam is irradiated onto the silicon film formed on the substrate which is disposed on a stage 925 within the laser processing chamber 904.

The stage 925 includes a heater for heating the substrate therein and is capable of heating the substrate. Also, the stage 925 is movable in one direction, and a linear beam is irradiated onto the substrate while the substrate is scanned by the beam. A laser beam can be irradiated onto the entire substrate by irradiating a linear laser beam thereon while moving the stage 925.

Also, the stage 925 can be rotated in such a manner that the scanning direction of a laser beam is so changed as to irradiate the laser beam. Doing so, the uniformity of the effect due to the irradiation of a laser beam can be enhanced.

Similarly, in the laser processing chamber 904, there are disposed an inactive gas introducing system 919 for purge and an air exhausting pump 920 for realizing the exhaust of an unnecessary gas and a high vacuum state.

A substrate transporting chamber 905 is a chamber having a function of transporting (conveying) the substrate 911 by a robot arm 922. Similarly, in this chamber, there are disposed an inactive gas introducing system 923 for purge and an air exhausting pump 924 for making the interior of the chamber in a high vacuum state. Also, the robot arm 922 includes a heater therein so that the transported substrate is not changed in temperature.

Hereinafter, a description will be given of a process of conducting a plasma processing on the amorphous silicon film formed on the glass substrate, irradiating a laser beam onto the silicon film in a heated state to crystallize the amorphous silicon film into a crystalline silicon film.

First, in an initial stage, the respective gate valves are in a closed state. The transporting chamber 905, the laser processing chamber 904, the heating chamber 903 and the plasma processing chamber 902 are held in a high vacuum state.

In this state, a large number of glass substrates are first received in a cassette 910 shown in FIG. 14 (in this state, the cassette is outside of the device). A silicon oxide film having a thickness of 3000 Å is formed on the glass substrate as an under film, and an amorphous silicon film having a thickness of 500 Å is further formed thereon.

The door 914 of the take-in/take-out chamber 901 is opened, and the cassette 910 in which the glass substrates are received is taken in the take-in/take-out chamber 901. Then, the door 914 (shown in FIG. 14) is closed. After the door 914 has been closed, the take-in/take-out chamber 914 is filled with a nitrogen gas before being made in a high vacuum state. In this state, all the chambers are made in a high vacuum state. The interior of the heating chamber 903 has been heated at a temperature of 550° C.

Subsequently, the gate valves 906 and 907 are opened. Then, one substrate is drawn out from the cassette 910 within the take-in/take-out chamber 901 by the robot arm 922. The substrate is transported within the plasma processing chamber 902. Thereafter, the gate valves 906 and 907 are closed.

Subsequently, in the plasma processing chamber 902, a hydrogen gas is introduced from the gas introducing system 916, and hydrogen plasma using the ECR condition is generated in a predetermined decompression state before a plasma processing is conducted on the amorphous silicon film formed on the glass substrate.

Hydrogen is eliminated in the amorphous silicon film through the plasma processing, and binding between silicon atoms is increased so that the state is changed into a more order state. This state is a state where the amorphous silicon is liable of being very crystallized, that is, a transitional state which is also called a quasi-crystalline state.

The transitional state is a very unstable state. Accordingly, when being brought in contact with air, compound of oxygen, nitrogen and carbon components contained in air, etc., are formed on the surface of the silicon film and in the interior thereof. This leads to the remarkable deterioration of a film quality.

In view of the above, after the plasma processing has been finished in the plasma processing chamber 902, the plasma processing chamber is made in a high vacuum state. Then, the gate valves 907 and 908 are opened. In this state, the transporting chamber 905 and the heating chamber 903 are held in a high vacuum state.

Thereafter, the substrate is drawn out from the plasma processing chamber by the robot hand 922 and transported to the heating chamber 903. Then, the gate valves 907 and 908 are closed.

The above-mentioned operation is repeatedly conducted to thereby receive a predetermined number of substrates (this number is made to coincide with the number of substrates which are initially received in the cassette) in the heating chamber 903. The number of received substrates is determined in accordance with an elapse time since the first substrate has been received in the heating chamber.

After the predetermined number of substrates have been received in the heating chamber 903, the gate valves 908 and 909 are opened. Then, the substrate is transported from the heating chamber 903 to the laser processing chamber 924 by the robot arm 922. It should be noted that, in this situation, a portion of the robot arm 922 which is in contact with the substrate is made in a state where it is held at a temperature of 550° C. by heating due to the internal heater.

Subsequently, the gate valves 908 and 909 are closed. Then, the silicon film which has been subjected to the plasma processing is crystallized by the irradiation of a laser beam. In this situation, the irradiation of a laser beam is conducted while the substrate is held at a temperature of 550° C. The irradiation of a laser beam is conducted while a linear beam is being moved in a direction perpendicular to the longitudinal direction of the linear beam, whereby a laser beam is irradiated over the entire surface of the silicon film. Also, an atmosphere in which a laser beam is irradiated onto the surface is set in a high vacuum state.

After the irradiation of a laser beam has been finished, the gate valves 909 and 906 are opened, and the substrate within the laser processing chamber 904 is transported to the take-in/take-out chamber 901 by the robot arm 922. Then, the gate valve 906 is closed, and the gate valve 908 is opened. Thereafter, the substrate received in the heating chamber 903 is taken out by the robot arm 922 and transported to the laser processing chamber 904. Thereafter, the gate valves 908 and 909 are closed. The irradiation of a laser beam is again conducted.

In this way, the substrates received in the heating chamber 903 are processed one by one, and the substrates which have been processed are sequentially received in the cassette 910 within the take-in/take-out chamber 901. After a sequence of processes have been finished, the interior of the take-in/take-out chamber 901 is made in an atmosphere state using an inactive gas under a state where the gate valve 906 is closed. Then, the door 914 is opened, and the cassette 910 is taken out to the exterior of the device. Thus, the processing has been finished.

In the structure shown in this embodiment, the silicon film which has been subjected to the plasma processing is transported to the heating chamber 903 with being out of contact with an atmosphere or contaminated gas, and then transported from the heating chamber 903 to the laser processing chamber 904 with being out of contact with an atmosphere or contaminated gas. Hence, the silicon film which has been subjected to the plasma processing is not contaminated.

The silicon film which has been subjected to the plasma processing is liable to be largely influenced by contamination. The influence of contamination is liable to largely appearing in the crystalline property of the crystalline silicon film obtained and the reproducibility thereof. Hence, the above-mentioned structure is very effective means in ensuring the crystalline property of the crystalline silicon film obtained.

Eighteenth Embodiment

Figure 15:
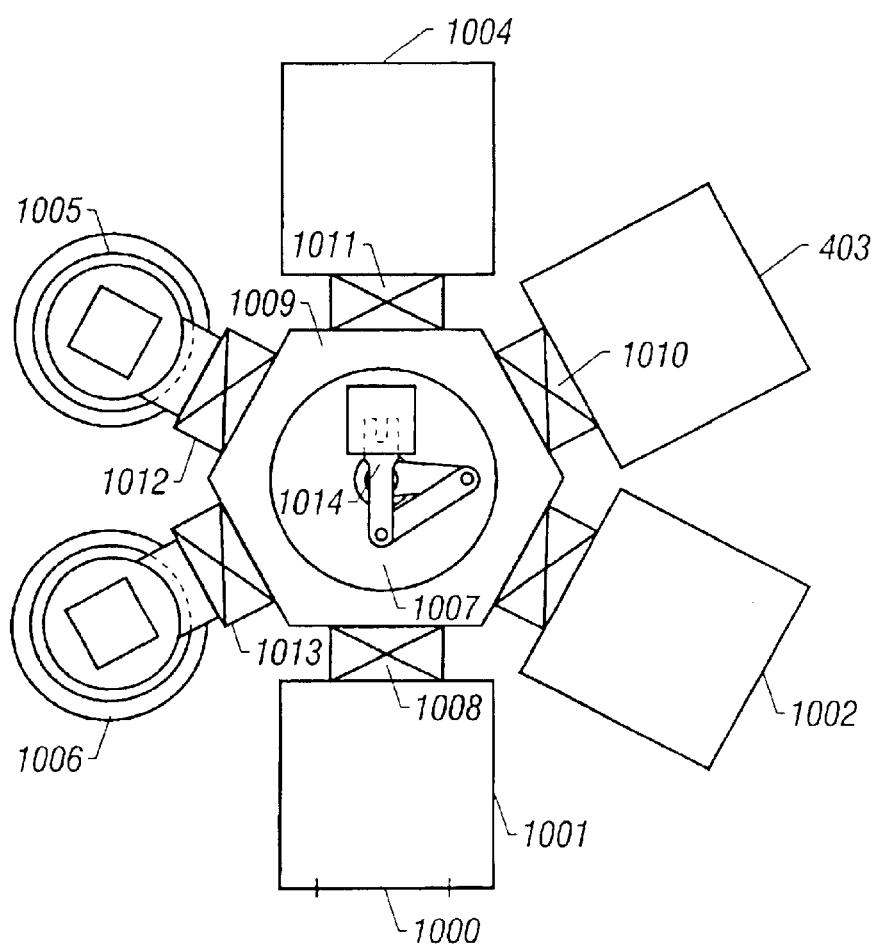
FIG. 15 is a schematic diagram showing an outline of a device for continuously conducting a plasma processing and a heating process.

An eighteenth embodiment relates to a device for conducting a plasma processing on an amorphous silicon film which is formed on a substrate and for conducting crystallization by heating the silicon film which has been subjected to the plasma processing. FIG. 15 shows a device in accordance with this embodiment.

The device shown in FIG. 15 is characterized in that 1) a step of forming a silicon oxide film on a substrate as an under film, 2) a step of forming an amorphous silicon film on the under film, 3) a step of conducting a plasma processing on the amorphous silicon film, and 4) a step of conducting a heat treatment to crystallize the amorphous silicon film are continuously conducted in an atmosphere where there is no contamination.

The device shown in FIG. 15 includes a substrate take-in/take-out chamber 1001, a parallel plane type plasma CVD device 1002 (film forming chamber) for forming an under silicon oxide film on a substrate, a parallel plane type plasma CVD device 1003 (film forming chamber) for forming an amorphous silicon film, a plasma processing device 1004 (plasma processing chamber) for conducting a plasma processing on the amorphous silicon film using an ECR plasma, heating chambers 1005 and 1006 for conducting a heat treatment on the silicon film which has been subjected to the plasma processing, a transporting chamber 1007 having a robot arm 1014 for conducting the transportation of the substrate between the respective chambers, and gate valves 1008, 1009, 1010, 1011, 1012 and 1013 for binding each chamber to the transporting chamber 1007 commonly connected to each chamber. Although being not shown, each chamber is equipped with a gas supply system for supplying a required gas, a gas exhaust system for realizing a required decompression state or a high vacuum state, and means for heating the substrate (except for the take-in/take-out chamber). Also, the plasma processing chamber has the same structure as that indicated by reference numeral 902 in FIG. 13. Also, the heating chamber is so designed as to receive a large number of substrates therein.

Hereinafter, an example in which the device shown in FIG. 15 is operated. First, all the chambers are made in a high vacuum state except for the take-in/take-out chamber. It is important that all the chambers have the same internal pressure in this high vacuum state. Also, all the gate valves are made in the closed state.

First, the door 1000 is opened so that a cassette (not shown) that receives a large number of glass substrates therein is received within the substrate take-in/take-out chamber 1001. Then, the door 1000 is closed so that the interior of the take-in/take-out chamber is filled with an inactive gas. Thereafter, the inactive gas is exhausted from the interior of the chamber into a high vacuum state.

Thereafter, the gate valves 1008 and 1009 are opened. One substrate is taken out by the robot arm and then transported to the film forming chamber 1002 for forming the silicon oxide film. Subsequently, the gate valves 1008 and 1009 are closed. Then, in the film forming chamber 1002 for forming a silicon oxide film, the silicon oxide film having a thickness of 3000 Å is formed on the glass substrate. The silicon oxide film is formed in order to prevent impurities from being deposited from the glass substrate in the amorphous silicon film which will be formed later. In the crystallization process which will be made later, the silicon oxide film is formed so that a stress exerted on the glass substrate and the silicon film is relieved.

After the formation of the under film has been completed, the interior of the film forming chamber 1002 is again made in a high vacuum state. Then, the gate valves 1009 and 1010 are opened. Thereafter, the substrate on the surface of which the silicon oxide film is formed is transported from the film forming chamber 1002 for forming the silicon oxide film to the film forming chamber 1003 for forming the amorphous silicon film.

Then, the gate valve 1009 is closed. In this situation, the gate valve 1009 remains opened. In the film forming chamber 1003 for forming the amorphous silicon film using a required gas, the amorphous silicon film having a thickness of 500 Å is formed. The amorphous silicon film is formed on the silicon oxide film which is formed on the glass substrate.

During the formation of the amorphous silicon film in the above-mentioned film forming chamber 1003, the gate valve 1008 is opened. One glass substrate is taken out from the cassette within the take-in/take-out chamber 1001 by the robot arm 1014 and then transported to the film forming chamber 1002 for a silicon oxide film. Subsequently, the gate valves 1008 and 1009 are closed. Then, the silicon oxide film is formed. That is, the amorphous silicon film is formed on the glass substrate in the film forming chamber 1002 while the amorphous silicon film is being formed in the film forming chamber 1003.

In this state, the formation of the amorphous silicon film in the film forming chamber 1003 and the formation of the amorphous silicon film in the film forming chamber 102 progress simultaneously.

After the formation of the amorphous silicon film in the film forming chamber 1003 and the formation of the silicon oxide film in the film forming chamber 1002 have been finished, the interior within the two film forming chambers is made in a high vacuum state. Then, the gate valves 1010 and 1011 are opened. In this situation, a period required for the formation of the amorphous silicon film in the film forming chamber 1003 is not always the same as that required for the formation of the amorphous silicon film in the film forming chamber 1002. In this case, the other film forming chamber is in a standby state until one film formation has been finished.

After the gate valves 1010 and 1011 are closed, the substrate is transported to the film forming chamber 1003 for forming the amorphous silicon film by the robot hand, and the film forming chamber 1003 is made in a high vacuum state. Subsequently, the gate valves 1010 and 1011 are opened. Then, the glass substrate on which the amorphous silicon film is formed is transported from the film forming chamber 1003 to the plasma processing chamber 1004 for conducting the plasma processing by the robot arm 1014.

Then, the gate valve 1011 is closed. Subsequently, a processing due to hydrogen plasma is conducted in the plasma processing chamber 1004. During the plasma processing, the gate valve 1009 is opened, and the glass substrate on which the silicon oxide film has been formed is drawn from the film forming chamber 1002 for forming the silicon oxide film and transported to the film forming chamber 1003 for forming the amorphous silicon film. Then, the gate valve 1010 is closed. Thereafter, the formation of the amorphous silicon film is conducted in the film forming chamber 1003.

After the formation of the amorphous silicon film in the film forming chamber 1003 is started, the gate valve 1008 is opened, and the glass substrate received in the cassette within the take-in/take-out chamber 1001 is drawn out by the robot arm 1014 and then transported to the film forming chamber 1002 for the silicon oxide film. Then, the gate valves 1008 and 1009 are closed.

After the plasma processing has been finished in the plasma processing chamber 1004, the plasma processing chamber is made in a high vacuum state. Thereafter, the gate valves 1011 and 1012 are opened. In this situation, the heating chamber has been heated to a temperature of 550° C. in advance. Then, the glass substrate which has been subjected to the plasma processing is taken out by the robot arm 1014. The drawn-out glass substrate is transported to the heating chamber 1005 by the robot arm. Then, the gate valve 1012 is closed.

Subsequently, the gate valve 1010 is opened, and the glass substrate on which the amorphous silicon film is formed is drawn out by the robot arm and transported to the plasma processing chamber. Then, the gate valve 1011 is closed. Thereafter, the gate valve 1009 is opened, and the glass substrate on which the silicon oxide film is formed is drawn out from the film forming chamber 1002 for forming the silicon oxide film by the robot arm and transported to the film forming chamber 1003 for forming the amorphous silicon film. Then, the gate valve 1010 is closed. The gate valve 1008 is opened, and the glass substrate is drawn out from the take-in/take-out chamber 1001 and transported to the film forming chamber 1002 for forming the silicon oxide film by the robot arm.

The above-mentioned operation is repeatedly conducted with the result that the glass substrates on which the plasma-processed silicon films are formed are received in the heating chamber 1005 one by one. When the heating chamber 1005 becomes full of the substrates, the substrates are received in the heating chamber 1006.

Subsequently, when four hours has elapsed since the first glass substrate is received in the heating chamber 1005, the first glass substrate is drawn out from the heating chamber by the robot arm and transported to a cassette within the take-in/take-out chamber 1001.

Next, when four hours has elapsed since the second glass substrate is received in the heating chamber 1005, the second glass substrate is drawn out from the heating chamber by the robot arm and transported to a cassette within the take-in/take-out chamber 1001.

In this way, the substrates received in the heating chamber for 4 hours is received in the cassette within the take-in/take-out chamber one by one, whereby the glass substrates which have been conducted on the heat treatment for 4 hours are received in the cassette. Similarly, in this case, it is important that the transportation of a substrate is conducted in a high vacuum state.

In the above-mentioned manner, the glass substrates on which the crystalline silicon films which have been crystallized by the heat treatment are formed are continuously obtained one by one. Finally, the door 1000 is opened while the interior of the take-in/take-out chamber 1001 is made in an atmosphere. Then, the cassette is taken out to the exterior of the device with the result that the process using the device shown in FIG. 15 is completed.

In the process of this embodiment, it is important that a period while the glass substrate remains in the film forming chamber 1002 for forming the silicon oxide film, a period while the glass substrate remains in the film forming chamber 1003 for forming the amorphous silicon film, and a period while the substrate remains in the plasma processing chamber 1004 are made identical to or substantially identical to each other. This is because the processes continuously flow by conducting the processings simultaneously and sequentially shifting the processings in those chambers.

When the above-mentioned process is applied, since an uncertained factor that adversely affects the crystallization of the amorphous silicon film can be removed, a crystalline silicon film having the uniform crystalline property and electric characteristic can be obtained. Also, the above-mentioned process is conducted by computer control, thereby being capable of continuously conducting the work. Then, a high productivity can be obtained.

Nineteenth Embodiment

A nineteenth embodiment shows another structure of a plasma processing device (plasma processing chamber) indicated by reference numeral 902 in FIGS. 12 and 13 and reference numeral 1004 in FIG. 15. The device shown in this embodiment can be used instead of the device 102 in FIGS. 12 and 13 and the plasma processing device (plasma processing chamber) 1004 in FIG. 15. The structure shown in this embodiment uses the structure disclosed in Japanese Patent Unexamined Publication No. Hei 5-129235 and No. Hei 6-310494.

Figure 16:
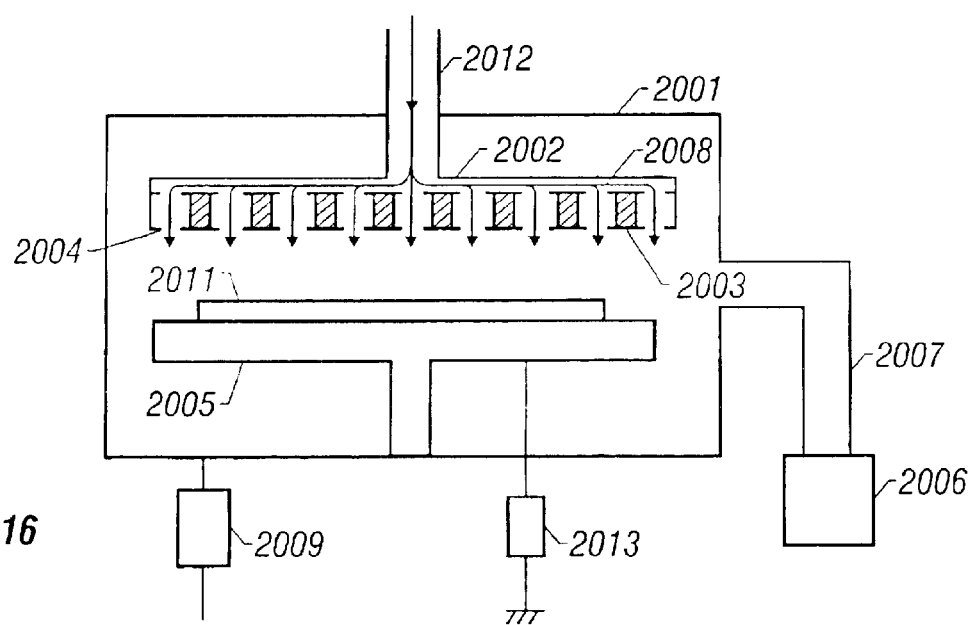
FIG. 16 is a diagram showing an outline of a device for conducting a plasma processing.

FIG. 16 shows the outline of the plasma processing device in accordance with this embodiment. The device shown in FIG. 16 is characterized in that the ECR condition can be generated over a large area. In the device shown in FIG. 16, reference numeral 2001 denotes a decompression chamber having an airtightness that allows its interior to be in a required decompression state and also in a required high vacuum state.

Microwaves of 2.45 GHz are supplied to the interior of the decompression chamber 2001 from an oscillator 2006 through a guidewave 2007. Reference numeral 2002 denotes magnetic field generating means and gas introducing means that has a structure in which a large number of permanent magnets 2003 and a gas are uniformly introduced over a large area as indicated by reference numeral 2008.

As a gas for generating plasma supplied from the gas supply system 2012, hydrogen gas, helium gas or a gas that mainly contains at least one of those gases is selected.

The substrate which will be subjected to a plasma processing is disposed on the substrate stage 2005. A heater for heating the substrate is installed in the substrate stage 2005. Reference numeral 2009 denotes an air exhaust pump which can make the interior of the chamber 2001 in a required decompression state or in a required high vacuum state.

Also, the substrate stage 2005 also serves as an electrode and structured such that a high frequency or constant potential bias can be supplied to the substrate 2011 from the power supply 2013.

Figure 17:
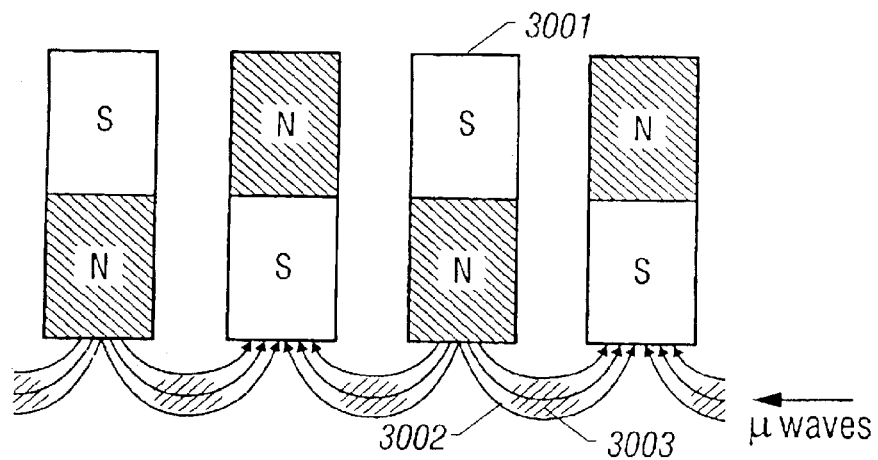
FIG. 17 is a diagram showing a means for generating a magnetic field.

FIG. 17 shows an enlarged state of a portion at which a permanent magnet 2002 of the magnetic field generating and gas introducing means 2005 is disposed. The permanent magnet is disposed such that polarities are alternately disposed as indicated by reference numeral 3001.

Figure 18:
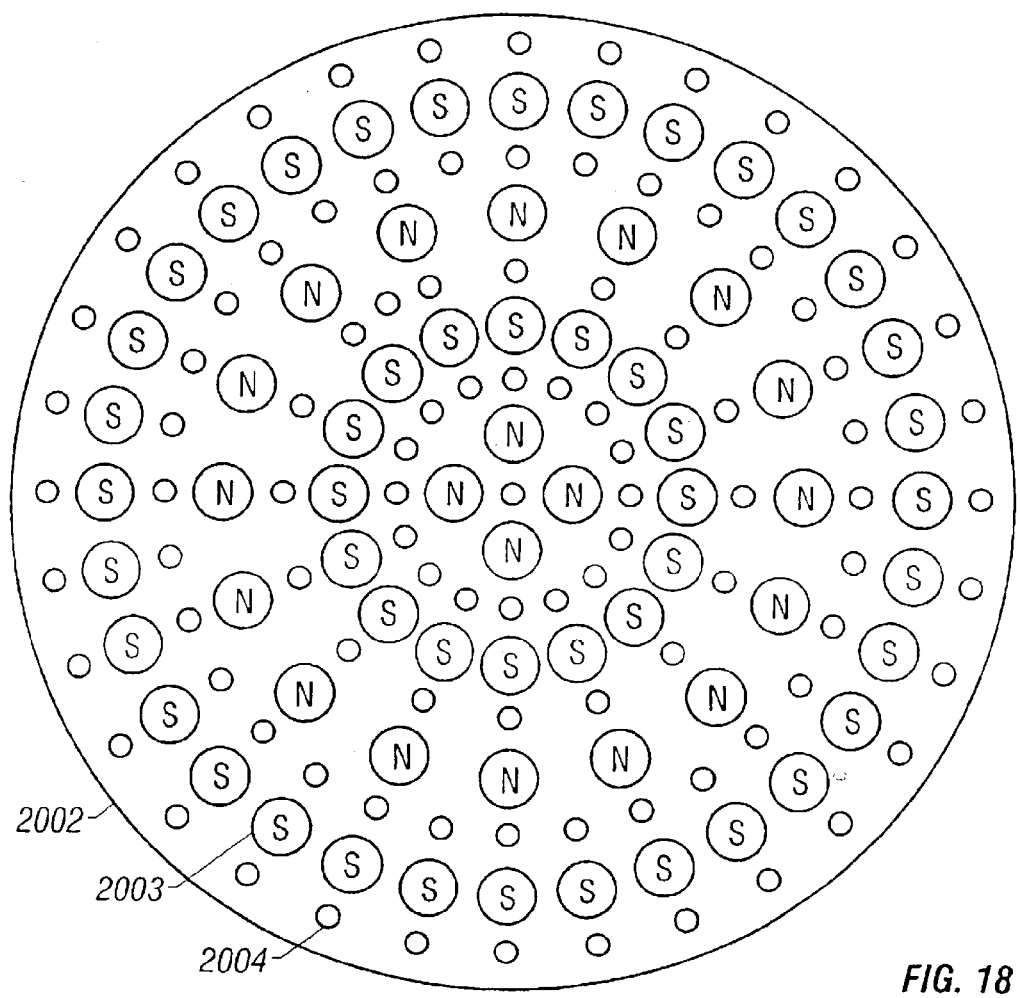
FIG. 18 is a diagram showing a state of a magnetic field generation means and gas introducing means 2005 viewed from a substrate stage 2005 side.

FIG. 18 shows a state in which the magnetic field generating and gas introducing means 2002 is viewed from the substrate stage 2005 side. The permanent magnets 2002 are disposed such that they are in a concentric circle and such that their polarities are alternately disposed. Then, a large number of hole 2004 for introducing a gas are disposed in such a manner that gas is uniformly blown out.

When the structure shown in FIGS. 17 and 18 are applied, a magnetic field density that satisfies the ECR condition is realized in a space region 3003 by the line of magnetic force 3002. This space is realized in the form of a ring just on a region where a hole 2004 for introducing a gas is formed in FIG. 18.

In other words, a space region of the magnetic flux density B that satisfies $2\pi f = eB/m$ exhibiting the ECR condition with respect to the frequency f of an incident microwaves ($\mu$ wave) is of a space region 3003. It should be noted that m is the mass of an electron, and e is the charge of an electron. It is needless to say that the frequency of microwaves and the intense of the permanent magnets are selected so that the above-mention expression is satisfied.

With such a structure, the ECR condition can be realized in the space region 3002. Although this region is not formed over the entire large region, plasma generated under the ECR condition can be used over the large region. In other words, even though the substrate 2011 is increased in area, the plasma processing can be conducted on the entire region.

As was described above, in a method of manufacturing a semiconductor device in accordance with the present invention, a processing due to hydrogen plasma or helium plasma is conducted on the amorphous silicon film so that the amorphous silicon film can be first changed into a transitional state where crystallization is liable to largely progress, which is called "a quasi-crystalline state". Then, in this state, the heat treatment or the irradiation of a laser beam while heating is conducted, whereby a crystalline silicon film can be obtained with a heating temperature and a heating period which are withstood by the glass substrate.

Therefore, a crystalline silicon film can be obtained on a glass substrate or a substrate having other insulating surfaces at a relatively low temperature (this temperature means, for example, a temperature which is withstood by the glass substrate). In particular, a monocrystal-like region or a substantially monocrystal-like region can be formed on the glass substrate, and a thin-film transistor can be formed using that region. Also, using that technique, an active matrix liquid-crystal display unit into which the peripheral drive circuits are integrated can be obtained using a thin-film transistor.

Further, using a device for manufacturing the semiconductor device in accordance with the present invention, a process for crystallizing the amorphous silicon film on a glass substrate or substrate having another insulating surface can be conducted with a high reproducibility. In particular, the crystalline silicon film which is excellent in the crystalline property can be conducted with a high reproducibility and a high productivity.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device comprising the steps of:
   forming a semiconductor film comprising amorphous silicon on an insulating surface;
   patterning said semiconductor film into at least one semiconductor layer;
   treating said at least one semiconductor layer with a plasma after said patterning step;
   providing said at least one semiconductor layer with a metal containing material for promoting a crystallization of said at least one semiconductor layer;
   crystallizing said at least one semiconductor layer by a heat treatment after said providing step and after said plasma treating step;
   forming a gate insulating film on said at least one semiconductor layer after said treating crystallizing step;
   implanting impurity ions into portions of said at least one semiconductor layer after forming said gate insulating film; and
   activating said impurity ions after said implanting step.

2. The method according to claim 1 wherein said activating step is conducted by irradiating said at least one semiconductor layer with a laser beam.

3. A method of manufacturing a semiconductor device comprising the steps of:
   forming a semiconductor film comprising amorphous silicon on an insulating surface;
   patterning said semiconductor film into at least one semiconductor layer;
   providing said at least one semiconductor layer with a metal containing material for promoting a crystallization of said at least one semiconductor layer;
   treating said at least one semiconductor layer with a plasma after said providing step;
   crystallizing said at least one semiconductor layer by a heat treatment after said plasma treating step;
   forming a gate insulating film on said at least one semiconductor layer after said treating crystallizing step;
   implanting impurity ions into portions of said at least one semiconductor layer after forming said gate insulating film; and
   activating said impurity ions after said implanting step.

4. The method according to claim 3 wherein said activating step is conducted by irradiating said at least one semiconductor layer with a laser beam.

5. A method of manufacturing a semiconductor device comprising the steps of:
   forming a semiconductor film comprising amorphous silicon on an insulating surface;
   patterning said semiconductor film into at least one semiconductor layer;
   treating said at least one semiconductor layer with a plasma of hydrogen or helium after said patterning step;
   providing said at least one semiconductor layer with a metal containing material for promoting a crystallization of said at least one semiconductor layer;
   crystallizing said at least one semiconductor layer by a heat treatment after said providing step and after said plasma treating step;
   forming a gate insulating film on said at least one semiconductor layer after said crystallization step;
   implanting impurity ions into portions of said at least one semiconductor layer after forming said gate insulating film; and
   activating said impurity ions after said implanting step.

6. The method according to claim 5 wherein said activating step is conducted by irradiating said at least one semiconductor layer with a laser beam.

7. A method of manufacturing a semiconductor device comprising the steps of:
   forming a semiconductor film comprising amorphous silicon on an insulating surface;
   patterning said semiconductor film into at least one semiconductor layer;
   providing said at least one semiconductor layer with a metal containing material for promoting a crystallization of said at least one semiconductor layer;
   treating said at least one semiconductor layer with a plasma of hydrogen or helium after said providing step;

crystallizing said at least one semiconductor layer by a heat treatment after said plasma treating step;

forming a gate insulating film on said at least one semiconductor layer after said crystallizing step;

implanting impurity ions into portions of said at least one semiconductor layer after forming said gate insulating film; and activating said impurity ions after said implanting step.

8. The method according to claim 7 wherein said activating step is conducted by irradiating said at least one semiconductor layer with a laser beam.

9. A method of manufacturing a semiconductor device comprising the steps of:

forming a semiconductor film comprising amorphous silicon on an insulating surface;

patterning said semiconductor film into at least one semiconductor layer;

treating said at least one semiconductor layer with a plasma in order to break bonds between silicon and hydrogen in said at least one semiconductor layer; and providing said at least one semiconductor layer with a metal containing material for promoting a crystallization of said at least one semiconductor layer;

crystallizing said at least one semiconductor layer by a heat treatment after said providing step and after said plasma treating step;

forming a gate insulating film on said at least one semiconductor layer after said crystallizing step;

implanting impurity ions into portions of said at least one semiconductor layer after forming gate insulating film; and activating said impurity ions after said implanting step.

10. The method according to claim 9 wherein said activating step is conducted by irradiating said at least one semiconductor layer with a laser beam.

11. A method of manufacturing a semiconductor device comprising the steps of:

forming a semiconductor film comprising amorphous silicon on an insulating surface;

patterning said semiconductor film into at least one semiconductor layer;

providing said at least one semiconductor layer with a metal containing material for promoting a crystallization of said at least one semiconductor layer;

treating said at least one semiconductor layer with a plasma in order to break bonds between silicon and hydrogen in said at least one semiconductor layer after said providing step;

crystallizing said at least one semiconductor layer by a heat treatment after said plasma treating step;

forming a gate insulating film on said at least one semiconductor layer after said crystallizing step;

implanting impurity ions into portions of said at least one semiconductor layer after forming said gate insulating film; and activating said impurity ions after said implanting step.

12. The method according to any one of claims 1, 3, 5, 7, 9 or 11 wherein said metal is at least one selected from the group consisting of Fe, Co, Ru, Rh, Pd, Os, Ir, Pt, Cu, Ag and Au.

13. The method according to any one of claims 1, 3, 5, 7, 9 or 11 wherein said semiconductor device is an active matrix liquid crystal device.

14. The method according to any one of claims 1, 3, 5, 7, 9 or 11 wherein said metal is nickel.

15. The method according to claim 11 wherein said activating step is conducted by irradiating said at least one semiconductor layer with a laser beam.

16. A method of manufacturing a semiconductor device comprising the steps of:

forming a semiconductor film comprising amorphous silicon on an insulating surface;

patterning said semiconductor film into at least one semiconductor layer;

treating said at least one semiconductor layer with a plasma in order to dehydrogenate said at least one semiconductor layer;

crystallizing said at least one semiconductor layer by a heat treatment after said providing step and after said plasma treating step;

forming a gate insulating film on said at least one semiconductor layer after said crystallizing step;

implanting impurity ions into portions of said at least one semiconductor layer after forming said gate insulating film; and activating said impurity ions after said implanting step.

17. The method according to claim 16 wherein said activating step is conducted by irradiating said at least one semiconductor layer with a laser beam.

18. A method of manufacturing a semiconductor device comprising the steps of:

forming a semiconductor film comprising amorphous silicon on an insulating surface;

patterning said semiconductor film into at least one semiconductor layer;

providing said at least one semiconductor layer with a metal containing material for promoting a crystallization of said at least one semiconductor layer;

treating said at least one semiconductor layer with a plasma in order to dehydrogenate said at least one semiconductor layer after said providing step;

crystallizing said at least one semiconductor layer by a heat treatment after said plasma treating step;

forming a gate insulating film on said at least one semiconductor layer after said treating crystallizing step;

implanting impurity ions into portions of said at least one semiconductor layer after forming said gate insulating film; and activating said impurity ions after said implanting step.

19. The method according to any one of claims 9, 11, 16, or 18 wherein said plasma is a plasma of hydrogen gas.

20. The method according to any one of claims 9, 11, 16 or 18 wherein said plasma is a plasma of helium gas.

21. The method according to claim 18 wherein said activating step is conducted by irradiating said at least one semiconductor layer with a laser beam.

22. A method of manufacturing a semiconductor device comprising the steps of:

forming a semiconductor film comprising amorphous silicon on an insulating surface;

patterning said semiconductor film into at least one semiconductor layer;

treating said at least one semiconductor layer with a plasma after said patterning step;

providing said at least one semiconductor layer with a metal containing material for promoting a crystallization of said at least one semiconductor layer;

crystallizing said at least one semiconductor layer by irradiating a light after said providing step and after said plasma treating step;

forming a gate insulating film on said at least one semiconductor layer after said crystallizing step;

implanting impurity ions into portions of said at least one semiconductor layer after forming said gate insulating film; and activating said impurity ions after said implanting step.

23. The method according to claim 22 wherein said metal is at least one selected from the group consisting of Fe, Co, Ru, Rh, Pd, Os, Ir, Pt, Cu, Ag and Au.

24. The method according to claim 22 wherein said semiconductor device is an active matrix liquid crystal device.

25. The method according to claim 22 wherein said metal is nickel.

26. The method according to claim 22 wherein said activating step is conducted by irradiating said at least one semiconductor layer with a laser beam.

27. A method of manufacturing a semiconductor device comprising the steps of:

forming a semiconductor film comprising amorphous silicon on an insulating surface;

patterning said semiconductor film into at least one semiconductor layer;

providing said at least one semiconductor layer with a metal containing material for promoting a crystallization of said at least one semiconductor layer;

treating said at least one semiconductor layer with a plasma after said providing step;

crystallizing said at least one semiconductor layer by irradiating a light after said plasma treating step;

forming a gate insulating film on said at least one semiconductor layer after said crystallizing step;

implanting impurity ions into portions of said at least one semiconductor layer after forming said gate insulating film; and activating said impurity ions after said implanting step.

28. The method according to claim 27 wherein said metal is at least one selected from the group consisting of Fe, Co, Ru, Rh, Pd, Os, Ir, Pt, Cu, Ag and Au.

29. The method according to claim 27 wherein said semiconductor device is an active matrix liquid crystal device.

30. The method according to claim 27 wherein said metal is nickel.

31. The method according to claim 27 wherein said activating step is conducted by irradiating said at least one semiconductor layer with a laser beam.

* * * * *